(12) United States Patent
Zhang et al.

(10) Patent No.: US 7,735,033 B2
(45) Date of Patent: Jun. 8, 2010

(54) MOSFET MODELING FOR IC DESIGN ACCURATE FOR HIGH FREQUENCIES

(75) Inventors: Xisheng Zhang, Sunnyvale, CA (US); Hancheng Liang, San Jose, CA (US); Zhihong Liu, Cupertino, CA (US); Jianhe Guo, Santa Clara, CA (US)

(73) Assignee: Cadence Design Systems, Inc., San Jose, CA (US)

( * ) Notice: Subject to any disclaimer, the term of this patent is extended or adjusted under 35 U.S.C. 154(b) by 212 days.

(21) Appl. No.: 11/959,068

(22) Filed: Dec. 18, 2007

(65) Prior Publication Data

US 2008/0109204 A1    May 8, 2008

Related U.S. Application Data

(62) Division of application No. 11/016,519, filed on Dec. 17, 2004, now Pat. No. 7,313,770, which is a division of application No. 10/616,765, filed on Jul. 9, 2003, now Pat. No. 6,851,097, which is a division of application No. 09/661,328, filed on Sep. 14, 2000, now Pat. No. 6,618,837.

(51) Int. Cl.
    *G06F 17/50* (2006.01)
(52) U.S. Cl. ............................................. 716/4; 716/5
(58) Field of Classification Search ............ 716/1, 716/4, 5, 6
    See application file for complete search history.

(56) References Cited

U.S. PATENT DOCUMENTS

| 5,301,118 | A | 4/1994 | Heck et al. |
|---|---|---|---|
| 5,610,833 | A | 3/1997 | Chang et al. |
| 5,761,082 | A | 6/1998 | Miura-Mattausch |
| 5,946,211 | A | 8/1999 | Glover |
| 6,018,623 | A | 1/2000 | Chang et al. |
| 6,061,222 | A | 5/2000 | Morris et al. |
| 6,068,660 | A | 5/2000 | Lu |
| 6,292,766 | B1 | 9/2001 | Mattos et al. |
| 6,295,635 | B1 | 9/2001 | Dhaene et al. |
| 6,637,018 | B1 | 10/2003 | Demler |
| 6,693,439 | B1 | 2/2004 | Liu et al. |
| 2003/0101418 | A1 | 5/2003 | Draxler et al. |

OTHER PUBLICATIONS

Ce-Jun et al., "Table based dynamic FET model assembled from small signal models," Jun. 1999, Microwave Theory and Techniques, IEEE Transactions on, vol. 47, Issue 6, pp. 700-705.

(Continued)

*Primary Examiner*—Sun J Lin
(74) *Attorney, Agent, or Firm*—Davis Wright Tremaine LLP

(57) ABSTRACT

The present invention presents methods for modeling the high frequency and noise characterization of MOSFETs. The models may be readily implemented as part of a SPICE or other simulation in a design flow. In particular, this invention is capable of providing a sub-circuit representation of a MOSFET that can accurately predicate a MOSFET's low frequency, high frequency, and noise characterizations. An interface is described through which a user may simultaneously optimize all of these characterizations. Further, methods are presented for building models that can predicate the variations in MOSFETs due to manufacturing processes and generate a corresponding corner model.

9 Claims, 12 Drawing Sheets

OTHER PUBLICATIONS

Wei et al., "Table based FET model assembled from small-signal models," Aug. 9-12, 1998, Radio and Wireless Conference 1998, RAWCON 98. 1998 IEEE pp. 355-358.

Howes et al., "A SOS MOSFET Spice model for confident analogue circuit design," Oct. 1-3, 1991, SOI Conference, 1991 Proceedings, 1991 IEEE International, pp. 90-91.

X. Jin "An Effective Gate Resistance Model for CMOS RF and Noise Modeling," Digest of Technical Papers IEDM—98, Dec. 1998, pp. 961-9694.

S.F. Tin et al., "A Simple Subcircuit Extension of the BSIM3V3 Model of CMOS RF Design," IEEE Journal of Solid—State Circuits, vol. 35, No. 4, Apr. 2000, pp. 612-623.

W. Liu et al., "RF MOSFET Modeling Accounting for Distributed Substrate and Channel Resistance with Emphasis on BMIM3V3 SPICE Model," Digest of Technical Papers IEDM—97, Dec. 1997, pp. 309-312.

S. H. Jen et al., "Accurate Modeling and Parameter Extraction of MOS Transistors up to 10 GHz," IEEE Transactions on Electronic Devices, vol. 46, No. 11, Nov. 1999, pp. 12217-12227.

C. Enz et al., "MOS Transistor Modeling for RF IC Design," IEEE Transactions on Solid State Circuit, vol. 35, No. 2, Feb. 2000, pp. 186-2001.

M. E. Mokari et al., "A New Method of Noise Parameter Calculation Using Direct Matrix Analysis," IEEE Transactions on Circuits and Systems—1: Fundamental Theory and Applications, vol. 39, No. 9, Sep. 1992, pp. 767-771.

T.E. Kolding, "Test Structure for Universal Estimation of MOSFET Substrate Effects at Gigahertz Frequencies," IEEE International Conference on Microelectronic Test Structures, Mar. 2000, pp. 106-111.

C. C. Su et al., "A monolithic 2.4 GHz CMOS Active Balanced Circuit," IEEE, vol. 2, Nov. 1999, pp. 214-217.

K. H. Kim, et al., "Full Software Analysis and Impedance Matching of Radio Frequency CMOS Integrated Circuits," IEEE Transactions on Components and Packaging Technologies, vol. 23, No. 1, Mar. 2000, pp. 183-189.

Hi-Deok Lee et al., "Characterization of Cross-Talk Induced Noise for 0.18 uM CMOS Technology with 6-level Metalization Using Time Domain Reflectometry and S. Parameters," IEEE: International Electronic Devices Meeting, Dec. 5, 1999, pp. 37.4-1-37.4.4.

J. J. Ou et al., "Submicron CMOS Thermal Noise Modeling from an RF Perspective," IEEE Symposium on VLSI Technology Digest on Technical Papers, 1999, pp. 151-152.

J. Zheng et al., "CAD-Oriented Equivalent Circuit Modeling of On-Chip Interconnects for RF Integrated Circuits in CMOS Technology," IEEE MTT-S International Microwave Symposium Digest, Jun. 1999, vol. 1, pp. 35-38.

Behzad Razavi, "CMOS Technology Characterization for Analog and RF Design," IEEE Custom Integrated Circuits Conference," 1998, pp. 3.1.1-3.1.8.

W. S. Kwan et al., "Hot-Carrier Effects on the Scattering of Lightly Doped Drain N-Type Metal-Oxide-Semiconductor Field Effects Transistors," Journal of Vacuum Science and Technology B: Micro Electronics and Nanometer Structures, vol. 16, No. 2, pp. 628-632.

C. E. Biber et al., "Improvements on a MOSFET Model for Non-Linear RF Simulations," 1997 IEEE MTT-S International Microwave Symposium Digest, Jun. 1997, vol. 2, pp. 865-868.

Jin-Young Choi et al., "Effects of Substrate Resistance on Microwave Characteristics of MOS Transistors," Journal of Electrical Engineering and Information Science, 1999, vol. 4, No. 2, pp. 244-248.

Jin-Young Choi, "Macro Modeling of MOS Transistors for RF Applications," Journal of the Institute of Electronic Engineers of Korea, 1999, vol. 36-D, No. 5, pp. 54-62.

Weidong Liu et al., "BSIM4.0.0 MOSFET Model-Users Manual," U. C. Berkeley—Dept. of Electrical Engineering and Sciences, 2000, pp. 1.1-13.14.

Behzad Razavi, "CMOS Technology Characterization for Analog and RF Design," IEEE Custom Integrated Circuits Conference," 1998, pp. 3.1.1-3.1.8, 1998.

Hewlett-Packard Application Note 57-1, Fundamentals of RF and Microwave Noise Figure Measurements, pp. 1-40, 1983.

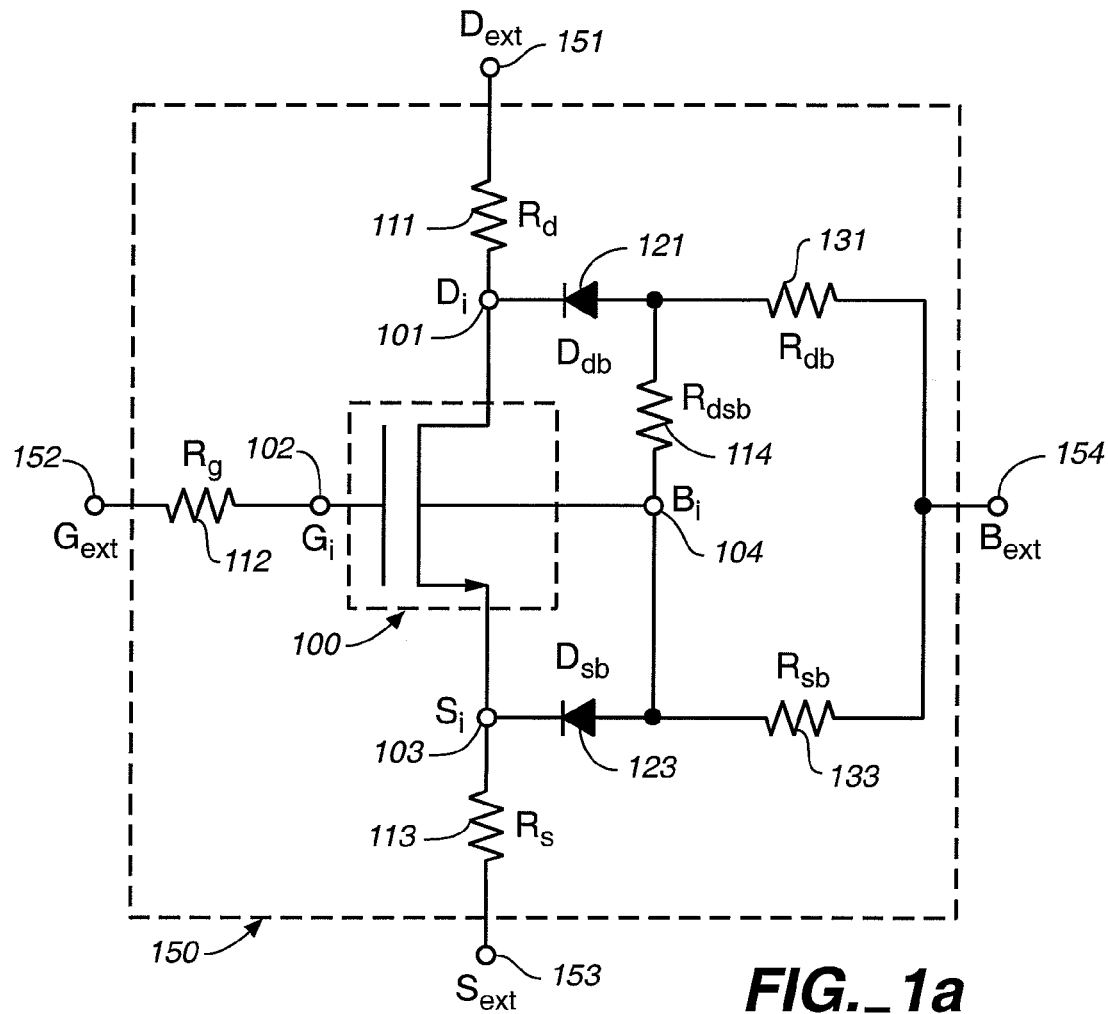
FIG._1a
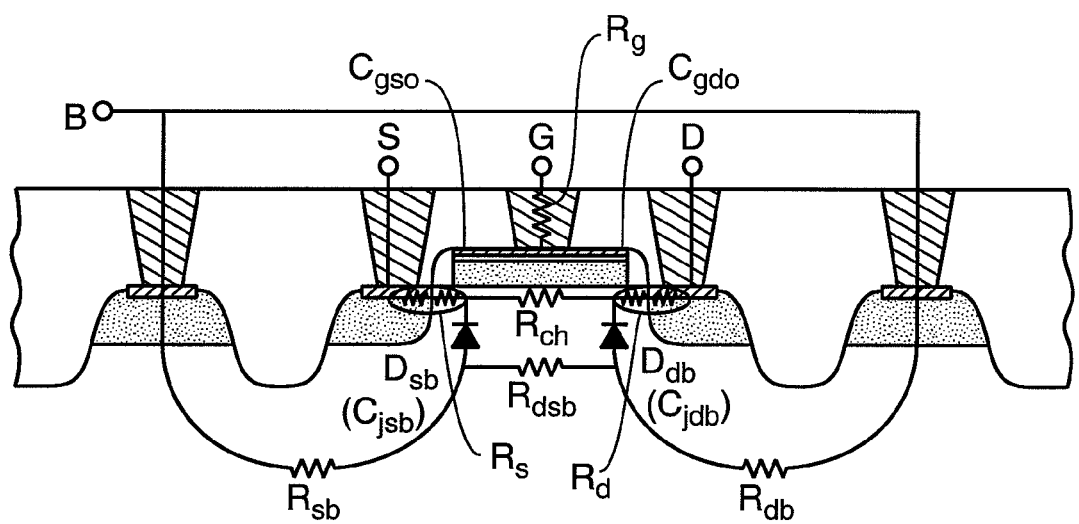
FIG._1b

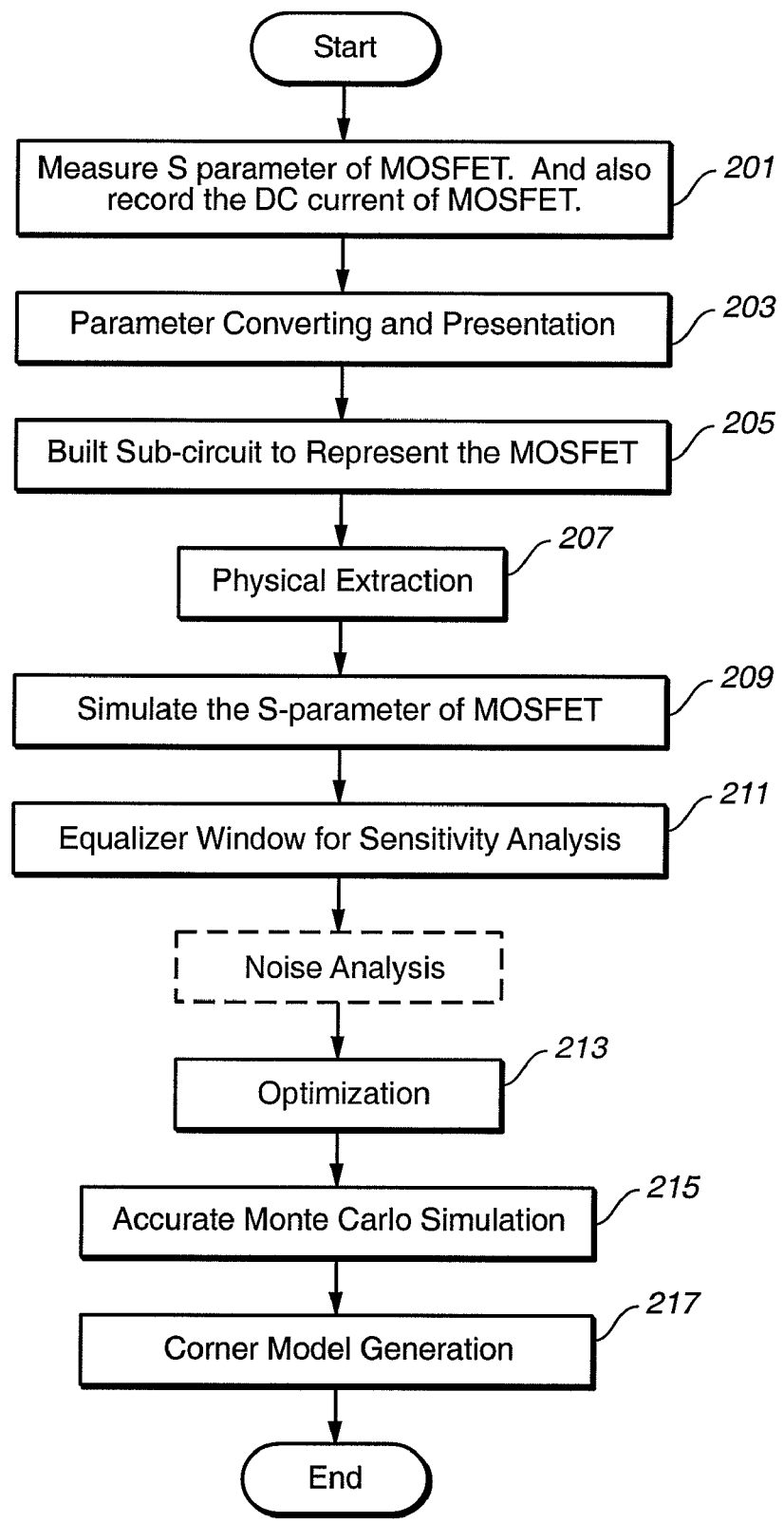
FIG._2

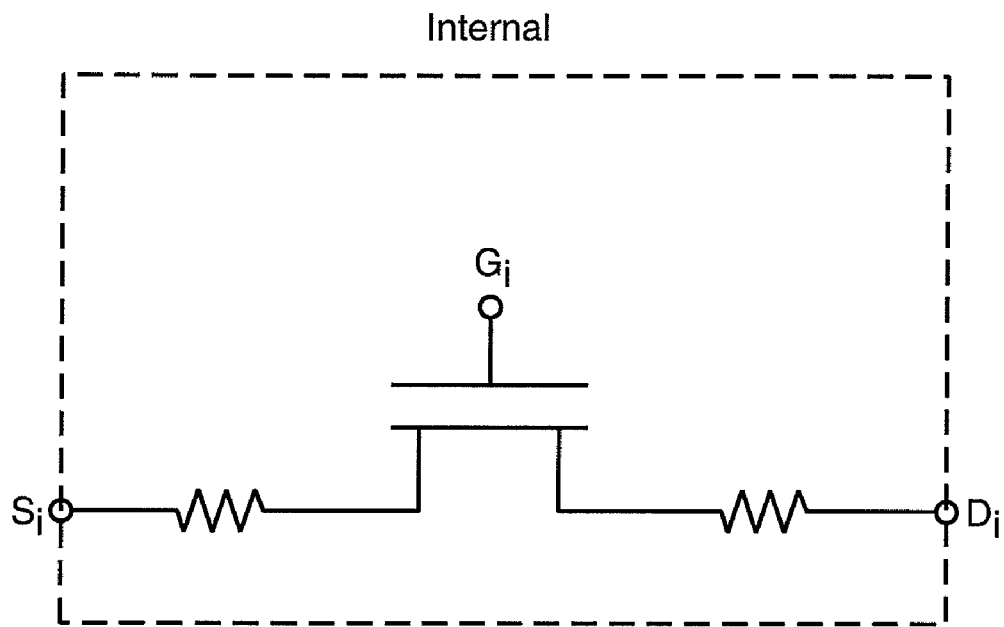
FIG._3a
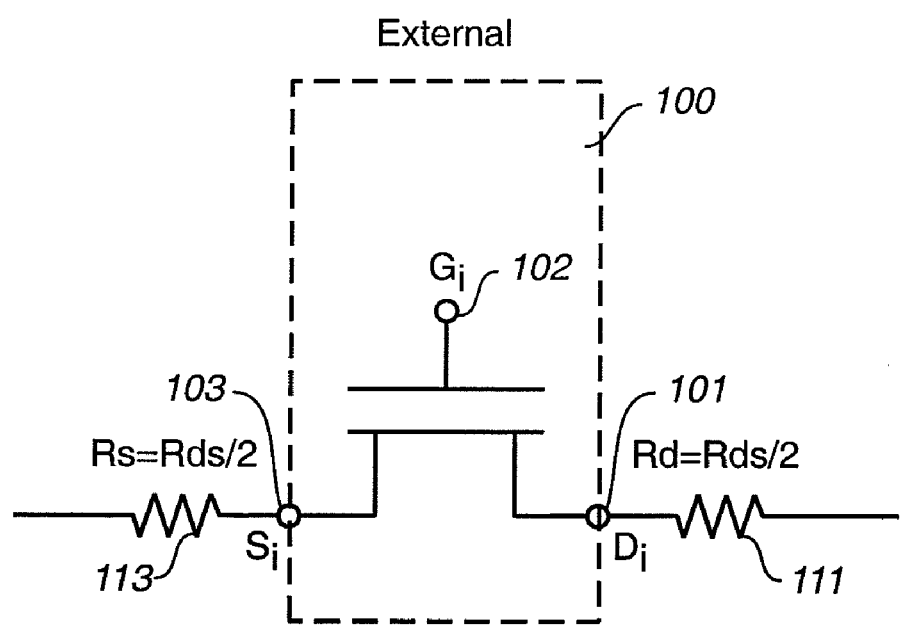
FIG._3b

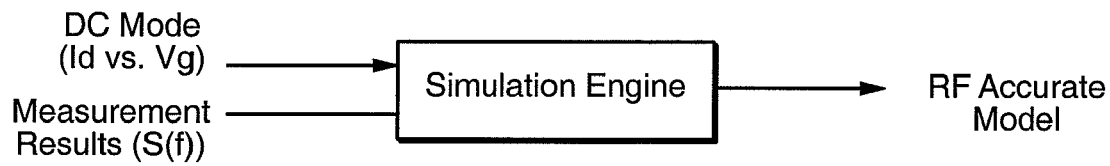
FIG._4
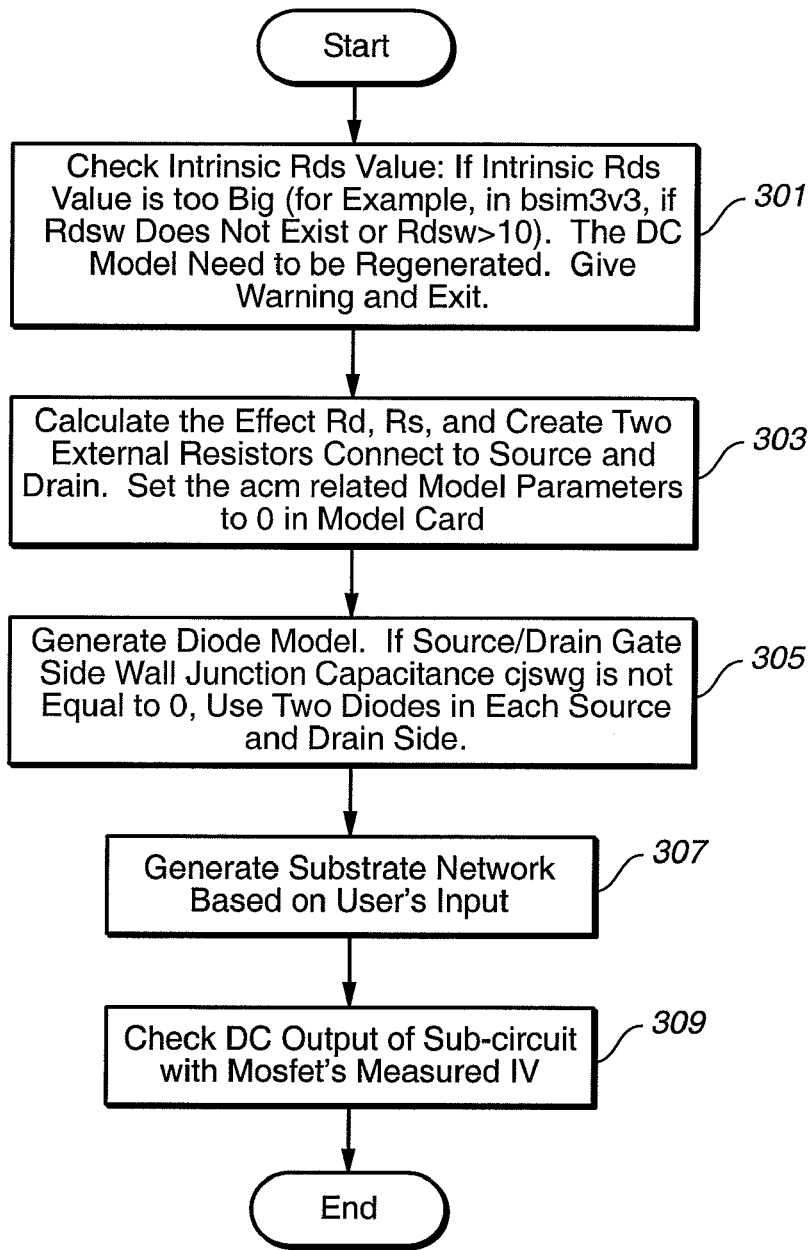
FIG._5

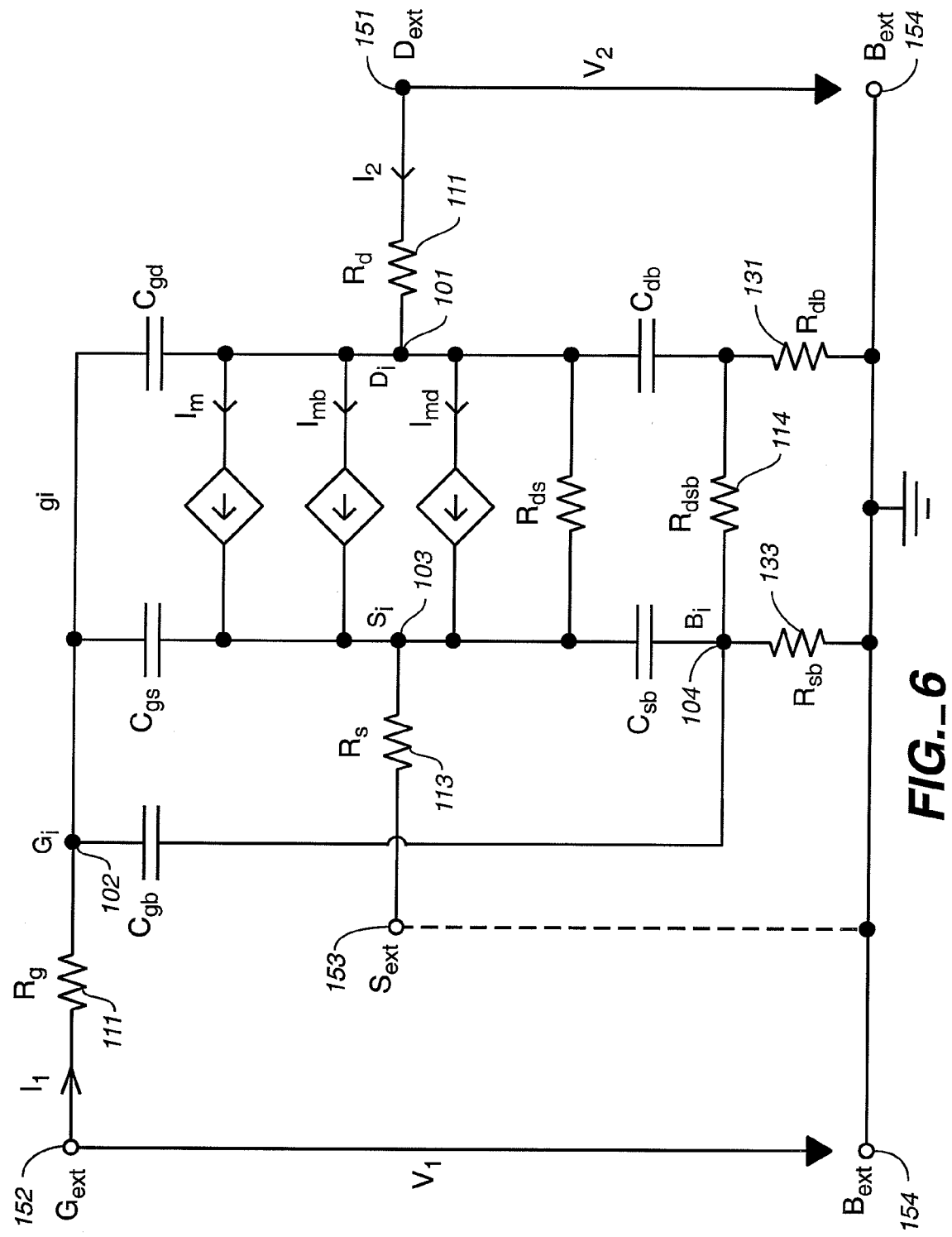
FIG._6

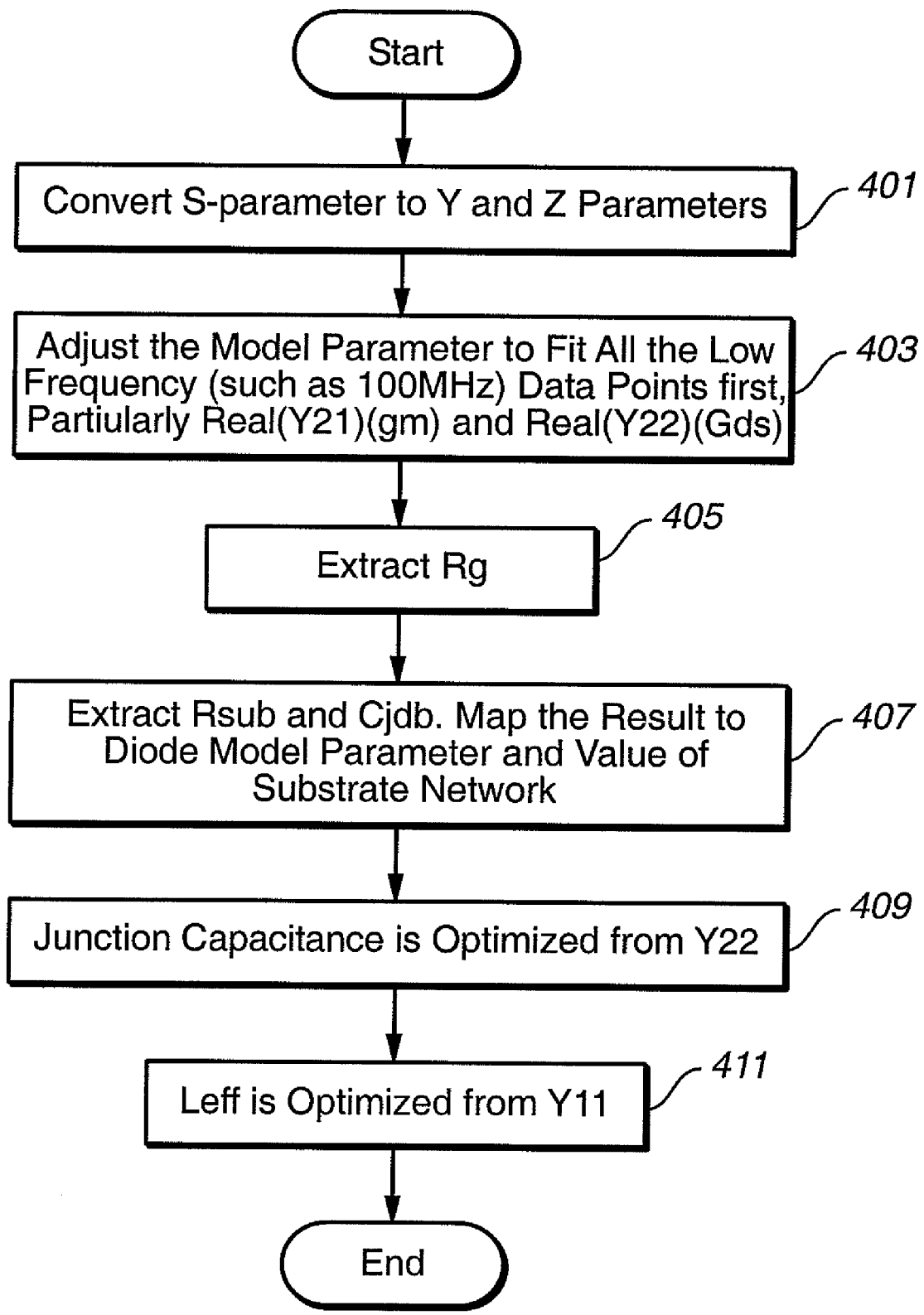
FIG._7

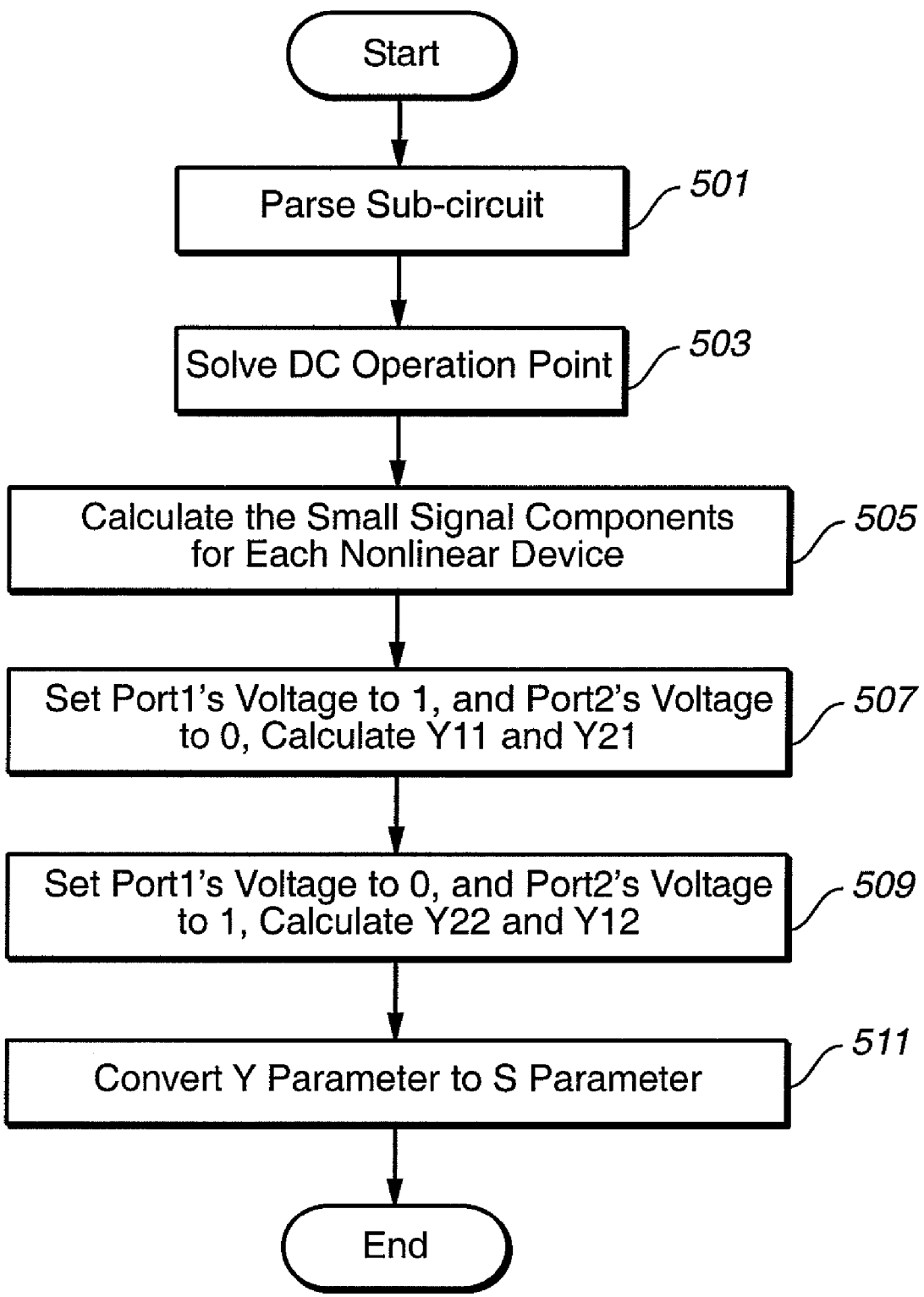
FIG._8

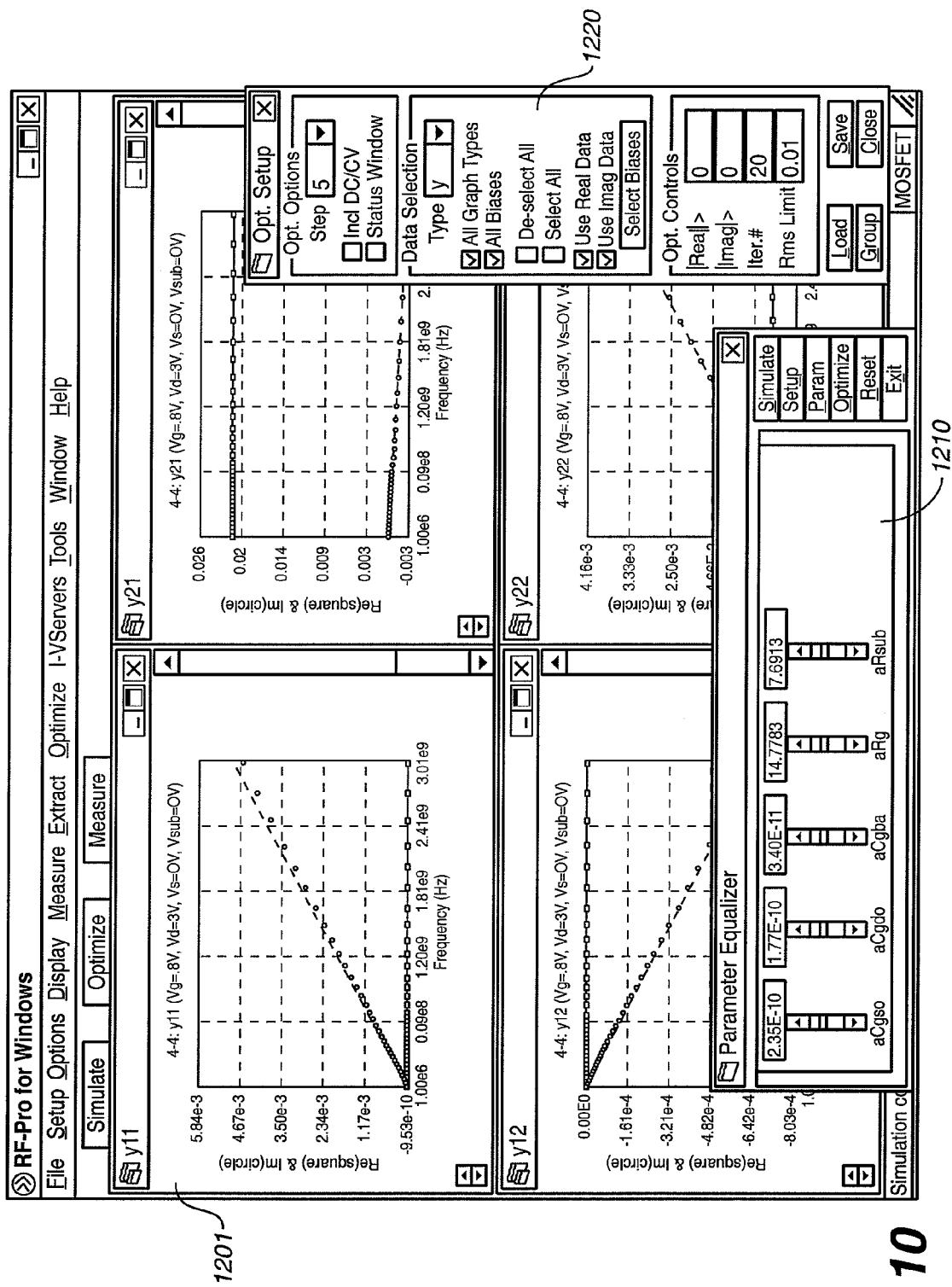
FIG._10

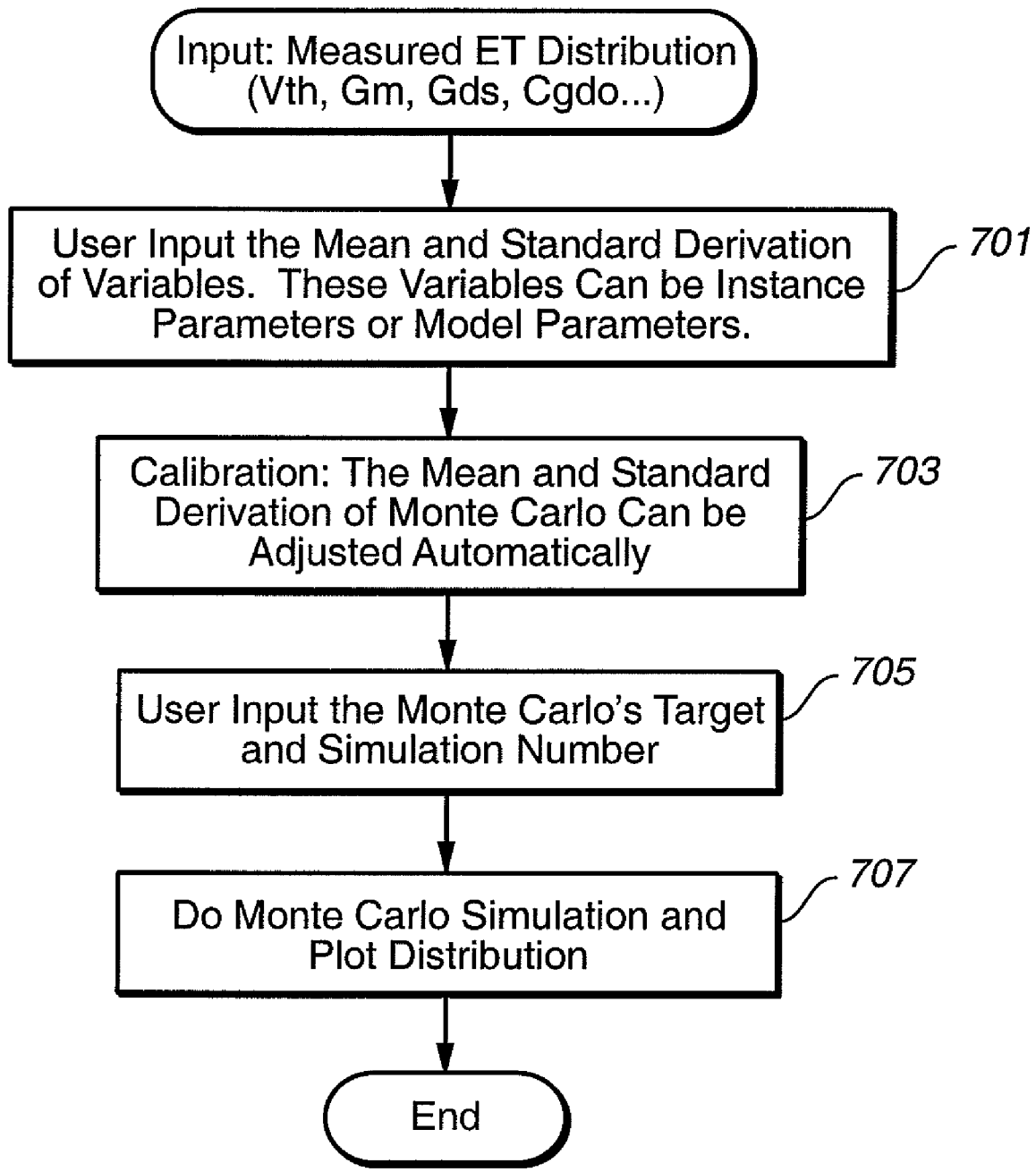
FIG._11

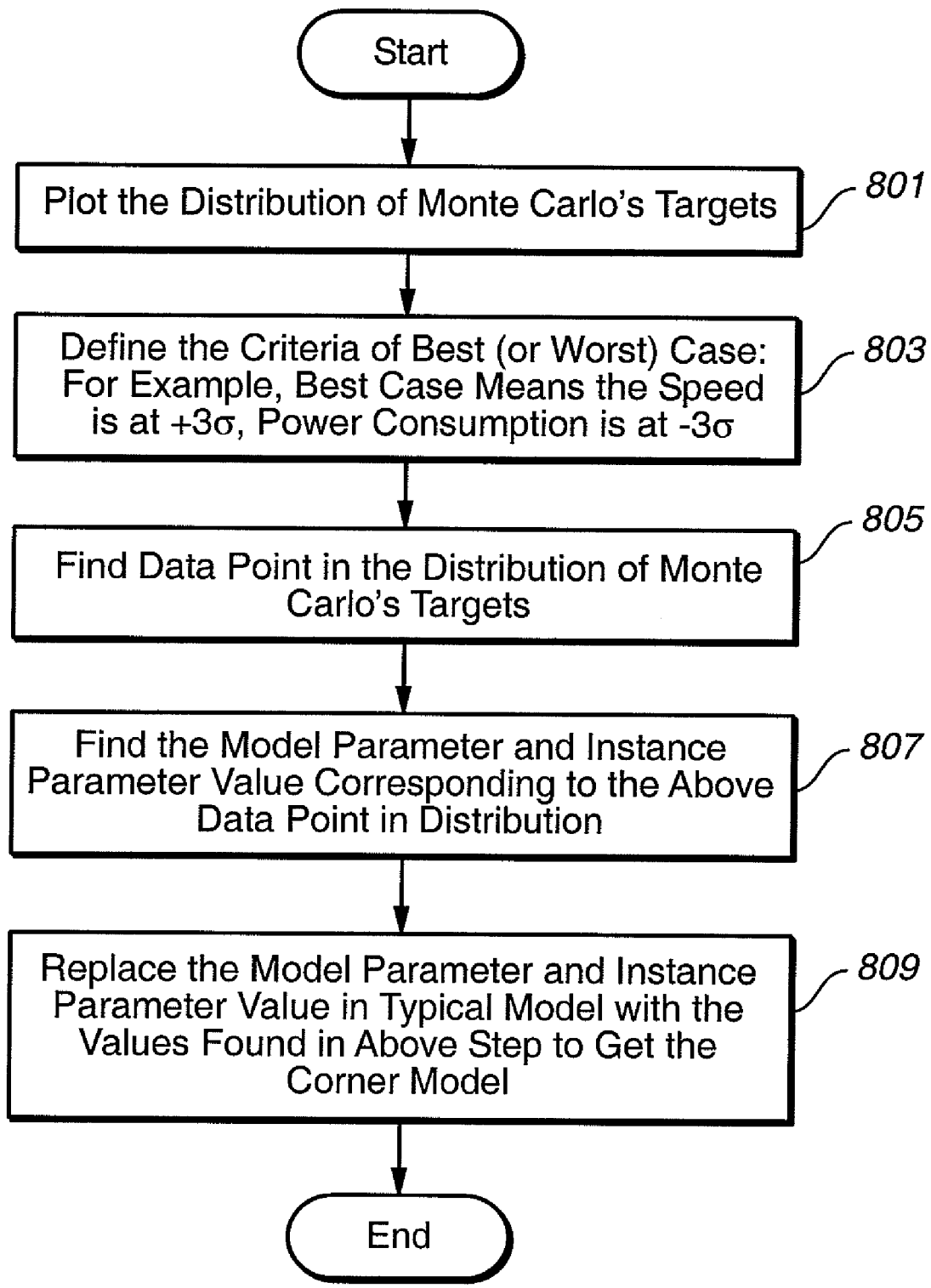
FIG._12

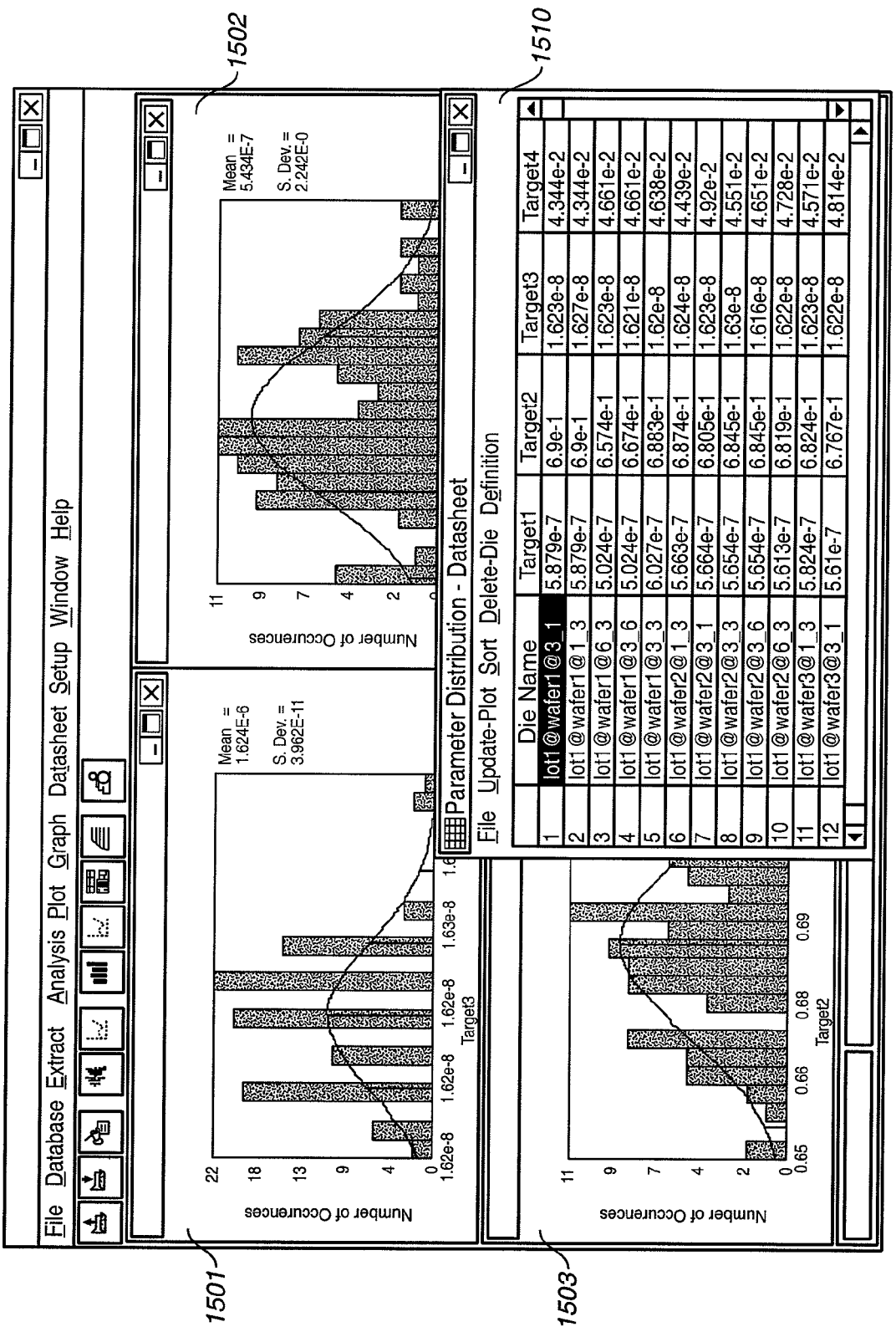
FIG._13

MOSFET MODELING FOR IC DESIGN ACCURATE FOR HIGH FREQUENCIES

CROSS REFERENCE TO RELATED APPLICATIONS

This application is a divisional of application Ser. No. 11/016,519, filed on Dec. 17, 2004, now U.S. Pat. No. 7,313,770, which in turn is a divisional of application Ser. No. 10/616,765, filed on Jul. 9, 2003, now U.S. Pat. No. 6,851,097, which in turn is a divisional of application Ser. No. 09/661,328, filed on Sep. 14, 2000, now U.S. Pat. No. 6,618,837, which applications are incorporated herein in their entirety by this reference.

BACKGROUND OF THE INVENTION

1. Field of the Invention

The present invention relates generally to the simulation of electronic circuits and, more particularly, to the high frequency modeling of MOSFET circuit elements.

2. Background Information

MOSFET technology was originally developed for use in DC and low frequency applications. As early versions of this technology were incapable of operating properly at higher frequencies, bipolar junction and GaAs transistors were used for radio frequency applications. However, as MOSFET process technology has moved into the deep submicron region, the cut-off frequencies of such devices has increased into the tens of gigahertz, making MOSFET technology a serious alternative for high frequency circuit integration.

The use of entirely MOSFET technology for implementing circuits for radio frequency applications allows for maximum integration of the RF front end, baseband logic, custom analog, and memory modules for complete systems on a single chip. Integration not only reduces device size, but allows system manufacturers to drive manufacturing costs down.

An important tool in the design of such large integrated circuits are methods of circuit simulation, the most familiar being SPICE. To run a SPICE or other circuit simulation, the circuit designer provides a description of the circuit, choosing a model for the various elements and specifying the parameter values, and the desired analysis, which specifies what sort of simulation will be performed in order to provide the desired output. This information forms a netlist which the designer runs to analyze the circuit.

The simulation tools available for non-linear MOSFET devices reflect the origin of this technology in DC and low frequency applications. While MOSFET devices now possess the performance needed for high frequency operation, the available design tools have yet to fully learn and embrace the intricate physical phenomena of such high speeds of operation. Without access to such "RF-ready" design tools, designers are hard pressed to design products that meet the tight constraints on power consumption and noise that leave very little margin for error.

One technique used in simulation is to replace non-linear elements in the netlist with a sub-circuit. Although it is possible to use a detailed equivalent circuit that accounts for all the physical elements that are part of a MOSFET transistor operating at high frequencies, the result is generally too complex to implemented as a compact model or sub-circuit for simulation. Additionally, many of the component values would be difficult or even impossible to extract and the resultant sub-circuit would contain a large number of internal nodes, greatly increasing the simulation time. Current techniques for the production of a sub-circuit for use in simulation of MOSFET circuits are extremely slow and often provide inaccurate results when pushed into the RF region. What is required is a MOSFET model that can accurately extend well into the gigahertz range, be quick, and still give accurate DC and low frequency AC fitting.

Another important consideration in circuit design is noise. In addition to providing a unified design tool that can accurately describe MOSFET operation in the DC region as well as its high frequency behavior, the model should preferably incorporated noise considerations. In this way, the designer can simultaneously consider all of these effects and emphasize those most important to overall circuit's characterization.

SUMMARY OF THE PRESENT INVENTION

The present invention presents methods for modeling the high frequency and noise characterization of MOSFETs. The models may be readily implemented as part of a SPICE or other simulation in a design flow. In particular, this invention is capable of providing models that can accurately predicate a MOSFET's low frequency, high frequency, and noise characterizations. Further, methods are presented for building models that can predicate the variations in MOSFETs due to manufacturing processes.

According to one aspect of the present invention, the method for modeling MOSFETs incorporates the device's high frequency characterizations while still maintaining an accurate DC and low frequency AC description. In the exemplary embodiment, this process begins with receiving DC characterizations of the device, such as terminal current vs. terminal voltage and terminal capacitance vs. terminal voltage. The resultant DC modeling can accurately predicate the low frequency characterizations and is converted into a sub-circuit which contains a intrinsic MOSFET and some parasitic elements. The topology of this sub-circuit is user definable. The S parameters of the device are also measured and are used in a de-embedding process to eliminate the parasitic effects. Physical extraction determines initial values for the sub-circuit elements. Once these values are set, the simulated device high frequency characterization is compared with measured characterization from the S parameters. An optimization procedure is used to reduce the difference between simulated and measured characterization by adjusting user selected model parameters, value of elements in sub-circuit, or a combination of both.

In an exemplary embodiment, when the DC model is converted into a sub-circuit, several key model parameters are checked, such as the source to drain resistance, $R_{dsw}$. If the resultant parameter values in model card are too big, then this model card is not readily adapted to the present process, or is not "RF-ready", and the DC model may need to be regenerated. Another example of a parameter which may be checked is the source to drain junction capacitance, $C_{jswg}$, possibly resulting in a pair of external diode elements being extracted and added to the sub-circuit, with one at the source terminal and the other at the drain terminal.

According to another aspect of the present invention, an improved method of simulating the device's response parameters is described which allows a user to optimize the sub-circuit more quickly. This is done by greatly reducing the number of iterations needed during this process. A simulation engine calculates the response of the device in Y parameter representation and subsequently converts them into S parameters. Additionally, not all data points are simulated: only a subset of these points are simulated with the rest interpolated. This allows the simulation to be performed in real time, allowing for an interactive optimization.

Another feature of the present invention optimizes the DC characterizations and high frequency characterization of the device simultaneously. As the high frequency characterization is a strong function of first derivative of the drain current, the model can no longer just fit the drain current, but must also fit its derivative. Due to the limitations of modelling, some trade off between DC fitting error and high frequency fitting error is usually necessary. By allowing the user to choose the targets for the optimization process, the user can perform a multi-object optimization and balance the relative importance of the DC and high frequency characterizations.

The present invention also provides a graphic user interface for performing the optimization process. The interface allows the user to select model parameters or elements within the sub-circuit, vary their values, and dynamically present the change of the simulated DC and high frequency characterizations. This provides an intuitive way to analysis the sensitivity of these parameters.

Further aspects of the present invention extend its methods to incorporate RF noise modeling. In one embodiment, after the high frequency model has been created, the measured minimum noise figure and optimum matching impedance are received after de-embedding. Physical extraction is performed and noise data is simulated and compared with measured data. Optimization is then performed to reduce the difference between the simulated and measured data. The optimization can again be done with the graphic user interface, but now dynamically showing the change of simulated DC and high frequency characterizations and noise data. In an exemplary embodiment, the simulation engine uses the "direct matrix method" to calculate the noise characterization. Several matrix arrays are opened in the engine for storing the frequency dependent and frequency independent components greatly improving optimization speed.

The present invention optimizes the DC characterizations, high frequency characterization, and noise data of the device simultaneously. The noise characterization is generally strongly dependent upon the DC and high frequency characterizations. Due the limitations of modelling, some trade off between DC fitting error, high frequency fitting error, and noise characterization is usually necessary. By again allowing the user to choose the targets for the optimization process, the user can perform a multi-object optimization and balance the relative importance of these elements.

An additional aspects of the present invention is modeling the variations in the high frequency characterization caused by the variations in semiconductor manufacture process. This provides process corner modeling extending into the high frequency region. An exemplary embodiment begins with receiving electrical test (ET) data and a typical model (sub-circuit) that can accurately predicate the DC, high frequency, and noise characterization. Based on these, the Monte Carlo method is used to simulate the result of process variations on the device.

The present invention provides a new method to calibrate the Monte Carlo result. First, the user selects input variables for the Monte Carlo simulation based on process information. These variables can be either the model parameters or elements of the sub-circuit. The user inputs information on the statistical distribution of the electrical test data to be used for calibration. A Monte Carlo simulation is used simulate the distribution of the electrical test data, with the statistical distributions of simulated and measured electrical test data then compared. The distribution of the of the Monte Carlo's input variables are correspondingly adjusted until the distributions sufficiently agree. The result is a "calibrated" set of input variables. With these calibrated variables, the user can accurately simulate the device or circuit characterization for the chosen output targets.

Additional objects, advantages, and features of the present invention will become apparent from the following description of its preferred embodiments, which description should be taken in conjunction with the accompanying drawings.

BRIEF DESCRIPTION OF THE DRAWINGS

FIG. 1a is an embodiment of a sub-circuit for high frequency MOSFET model.

FIG. 1b shows how the elements of FIG. 1a correspond to the physical MOSFET.

FIG. 2 is a flow chart for high frequency MOSFET modeling.

FIG. 3a shows a MOSFET with the drain and source resistances as internal model parameters.

FIG. 3b shows a MOSFET with drain and source resistances modelled using sub-circuit elements.

FIG. 4 is a box diagram of the concept behind the process shown in the flow chart of FIG. 2.

FIG. 5 is a sub-flow for building the sub-circuit from the DC model.

FIG. 6 is a small-signal equivalent circuit of FIG. 1a shown in a 2-port network configuration.

FIG. 7 is a sub-flow for physical extraction.

FIG. 8 is a sub-flow for simulating the S parameters.

FIG. 10 is an example of one embodiment of the equalizer window of step 211 in FIG. 2.

FIG. 11 is a sub-flow of the Monte Carlo simulation calibrated with electrical test results.

FIG. 12 is a sub-flow of corner model generation.

FIG. 13 is an example of how the corner model information is displayed.

DESCRIPTION OF THE PREFERRED EMBODIMENT

Figure 9:
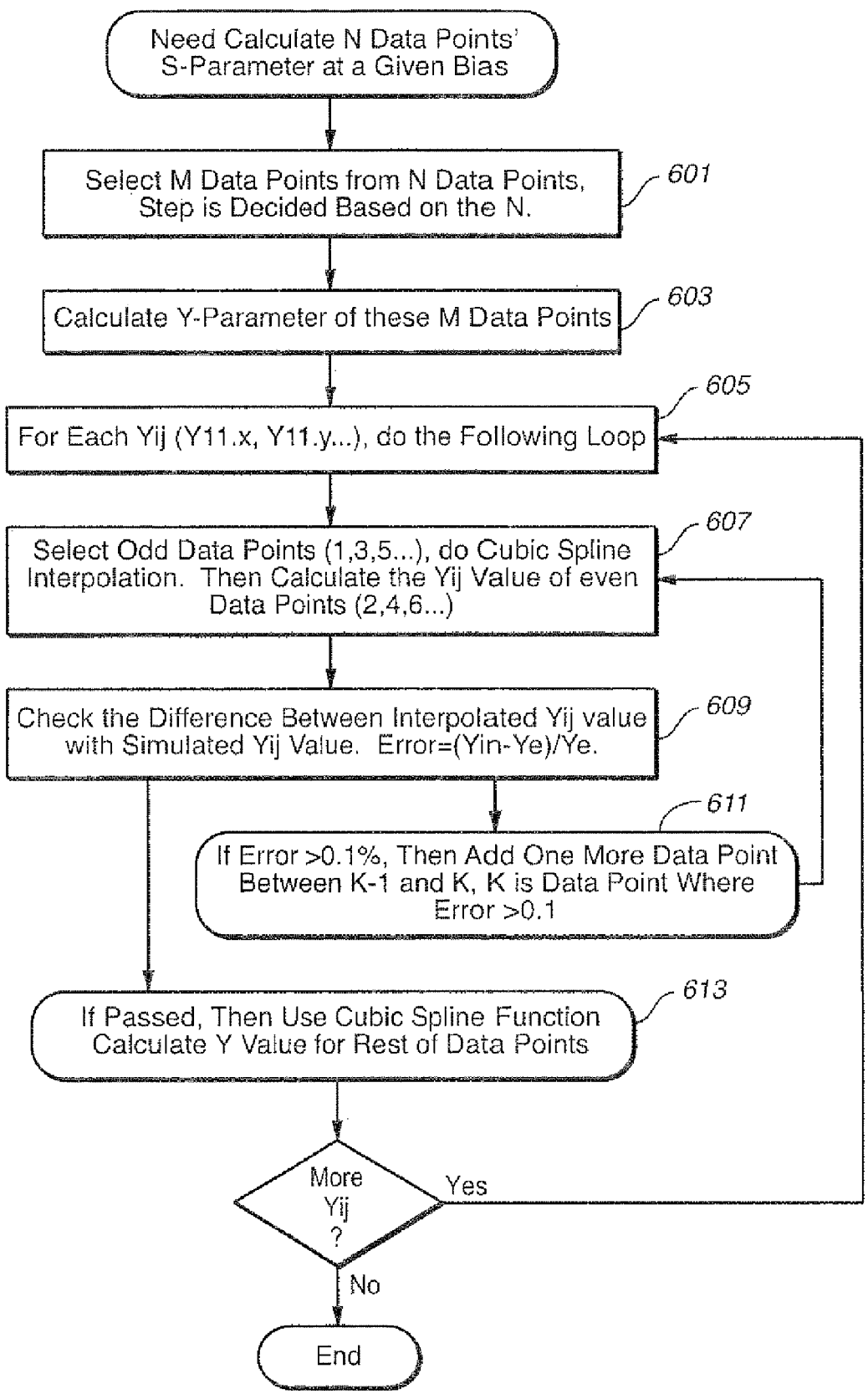
FIG. 9 is a sub-flow for the interpolation process of response parameters.

The main reasons why simulation results from traditional low frequency SPICE models are insufficient lies in the formulation of these low frequency models. These models were developed for digital and analog circuits that place their main emphasis on DC drain current, conductances, and intrinsic charge and capacitances behavior well below the megahertz range. As applications for MOSFET circuits have moved into the gigahertz ($10^9$ Hz) frequencies, extrinsic components have become increasingly important and need to be taken into account if the device is to be correctly modelled. One example of such an extrinsic component is the substrate resistance. At gigahertz frequencies, signals to the drain of the MOSFET can couple to the substrate and the source as a result of the decrease in impedance of the junction capacitances.

To account for this and other effects, a number of external elements can be attached to the nodes of a MOSFET, as in the example shown in FIG. 1a. This figure shows various external elements attached to the intrinsic MOSFET 100, whose terminals 101-104 have been labelled with the subscript i. These external elements, along with the intrinsic MOSFET 100, constitute the sub-circuit 150 with terminals 151-154 labelled with the ext subscript. The sub-circuit 150 is then used to replace the simple transistor 100 in the simulation, where a modelling flow extracts the parameters for the elements of subcircuit 150. The process of extracting and optimizing these external values to fit measured RF characteristics while still ensuring good DC and low frequency AC fitting results constitutes a high frequency MOSFET modelling methodology, such as the implementation described below.

FIG. 1b is a cross-section of a MOS transistor. This shows the physical origin of the various elements in the equivalent sub-circuit of FIG. 1a by superimposing these elements over the cross-section and using a corresponding labelling. The sub-circuit of FIG. 1a is just one example of the elements that can be included in the particular sub-circuit to represent a particular transistor. As described below, one aspect of the present invention is that the user is allowed to select the topology of the sub-circuit representation. For example, depending on the application, in FIG. 1a a different substrate resistance network may be selected, or a capacitor, inductor, or both may be added at the gate.

In addition to extracting parameters for the external elements, another physical effect which will be modelled is thermal noise. The effects of noise are an important consideration in circuit design and the present invention allows the optimization of noise data simultaneously with the optimization of the DC characterizations and the high frequency characterization. The discussion below first considers just the DC and high frequency portions of the method in order to simplify the exposition. The process including noise is similar in many aspects and will be discussed following the description of the corner model.

FIG. 2 presents a high frequency MOSFET modelling flow. In steps 201-213 the subcircuit for a particular transistor is constructed: when the effects of noise are included below, the additional steps will occur between steps 211 and 213. The result of this flow at the end of step 213 is a netlist file for the high frequency ready sub-circuit of a non-linear device in, for example, a SPICE embodiment. This sub-circuit is produced by the model engineer to be used by the designer as a "black box" that can be plugged into netlist of the larger circuit to provide a fast and accurate simulation without the designer having to worry about the details of the particular device. Subsequent steps 215 and 217 then calibrate the input parameters for the Monte Carlo process used to generate the corner model.

The flow begins at step 201 with the response of the transistor being measured, which, together with step 203, are data preparation. Step 201 measures the scattering, or S, parameters of the MOSFET. The use of S parameters avoids many of the problems found in other representations of response parameters, such as the Z, Y, or H representations, when measuring devices at high frequencies. At RF and microwave frequencies, lead inductance and fringing capacitance can effect the ability to make precise measurements on the MOSFET transistor. This can be exacerbated if the measurement scheme being used requires open and short circuit signal conditions, which are difficult to maintain under high frequency operations. With S parameter measurement, there is no need to uphold these criteria. Instead, S parameter measurements are made under impedance matching conditions, thereby avoiding unstable oscillation for active device measurement. The use of S parameters for the high frequency characterization of a two port network are well know in the art.

The measurements made using S parameters preferably go through a de-embedding process before they are used. This is largely because the measured data contains parasitics originating with the test structure itself. Effects such as pad and metal line parasitics should be removed before the data can used for modelling. A number of techniques are available and well know for the de-embedding process and can be applied to the data measured in step 201.

In addition to the S parameter measurements, the DC current of the drain terminal is also measured as part of step 201. This value will be used below in step 207 to correct the DC model.

In step 203 of FIG. 2, the parameters are converted and presented. Since the S parameter measurements made in step 201 are small-signal measurements, they lend themselves well to traditional small-signal circuit analysis. In order to use the S parameter data in this way, however, it is preferable to convert into an alternate response parameter representation. The most commonly used is the Y parameter representation, where the conversion is performed through a standard set of fixed equations. The Y parameters are the admittance, or the inverse of impedance, and describe the resultant current from a given voltage input. Aside from having a more familiar physical interpretation, when expressed in the Y parameter representation the data also have very smooth characteristics. These properties can be exploited during the sub-circuit optimization of step 213 of FIG. 2.

These parameters can be displayed in a number of different ways. In the preferred embodiments, a number of different choices are provided for the user to choose how these results are graphically displayed. These graphics are valuable for checking the validity of the measurement results. By allowing the user of choice of selecting which representation is used, and how the information is presented within that representation, the user can focus on the parameters that are most important for a given application.

This data can, for example, be presented in just the S representation, with $S_{11}$ and $S_{22}$ plotted in a smith chart, and $S_{12}$ and $S_{21}$ in a polar plot. The data can alternately, or additional, be displayed converted into the Y, Z, H, T, or ABCD representations. By presenting all of the different parameter sets at once, measurement results in these differing bases can be simultaneously be plotted at the same time in one graphic. Alternately, these can be plotted in different graphics with a scroll bar provided on the on-screen display so that the vertical bar can be used to browse each graphic. Each parameter can preferably also be plotted with variable scales for magnitude, phase, real, and imaginary parts, depending upon the choices made by the user.

Step 205 of FIG. 2 constructs the subcircuit representing the MOSFET from the DC model. This is a circuit such as that shown in FIG. 1a to represent extrinsic effects at high frequencies. The subcircuit model and its extracted parameters are meant to fit the measure Y parameters for a single device with multiple bias conditions. However, this fitting should be achieved while still maintaining good DC and low frequency AC fitting accuracy. This consideration can place additional requirements on the sub-circuit construction process.

FIGS. 3a and 3b show an example of this process for the source and drain resistors $R_s$ 113 and $R_d$ 111 of FIG. 1a. To describe the behavior of a MOSFET as done in the prior art, the netlist used in the simulation has number of parameters to describe the characteristics of the MOSFET. For example, in a common version of SPICE, HSPICE, the intrinsic description of the MOSFET is based on two sets of parameters, either of which may be used by the designer. The first set of intrinsic parameters is for the BSIM3V3 MOSFET model. The second set is referred to as the ACM parameters and is based on an area calculation method.

In FIG. 3a, the source and drain resistance are generated as part of the intrinsic description of the MOSFET. If the BSIM3V3 parameters are used, a number of intrinsic parameters are entered in to the model which then produces a resultant value for these resistors for a given set of bias conditions. If the ACM format is used, a different set of intrinsic parameters are entered to describe the transistor's physical properties and from these the model determines these the internal values of the resistance. In step 205, the internal source/drain resistance has been transferred to the external resistors $R_d$ 111 and $R_s$ 113 as shown in FIG. 3b, which is a detail of FIG. 1a.

In this way, the intrinsic device 100 has been simplified and the source/drain resistance made an explicit, external effect modelled using external elements in the sub-circuit. Correspondingly, all model parameters related to the intrinsic drain/source resistance calculation are turned off. This process can be considered as making the model card of the device "RF-ready" and consists of using the ACM format for the intrinsic parameters and setting their values so that do not duplicate those elements which are now placed external to the intrinsic MOSFET. The BSIM3V3 format is not used as the source/drain resistance varies with bias conditions in a way which will not be as accurately modelled as in the ACM format, resulting in poor curve fitting. It should also be noted that in the sub-circuit of FIG. 1a, a MOSFET 100 still remains at the center of the sub-circuit and will still have a number of intrinsic parameters which still need to be specified. In the process of making the corresponding model card RF-ready, it is only those parameters that are related to the sub-circuit components explicitly represented by external elements which are turned off.

Besides the source and drain resistances, an external gate resistance, $R_g$ 112 of FIG. 1a, is also added. This resistor preferably not only represents the physical gate electrode resistance, but also the resistance of the channel as seen from the gate. The physical gate resistance scales inversely with the channel length, L. The channel resistance is found to have channel length and bias ($V_{gs}$, $V_{ds}$) dependence, as described in X. Jin, "An Effective Gate Resistance Model for CMOS RF and Noise Modeling", *Digest of Technical Papers IEDM*-98, December 1998, page 961-964, which is hereby included by this reference. The resulting bias dependencies can be implemented with a voltage-controlled resistor.

External diodes $D_{sb}$ 123 and $D_{db}$ 121 are also added to FIG. 1a in order to model the coupling from, respectively, the source and the drain to the body. As with the resistance, once these external diodes are used in the sub-circuit, the intrinsic parameters corresponding to built-in junction diodes in the model card should be turned off. This is preferably done by setting all the area and perimeter calculation coefficients to zero. In particular, the ACM format contains the parameters $A_s$ and $P_s$ to respectively specify the area and perimeter of the source and corresponding parameters $A_d$ and $P_d$ for the drain. These parameters would all be set to zero as the external diodes now compensate for these intrinsic values.

FIG. 1a also shows several resistances, $R_{db}$ 131, $R_{sb}$ 133, and $R_{dsb}$ 114, connected to the substrate. The literature has suggested a physical basis for various implementations using from one to four individual resistors as, for example, in S. F. Tin, et al., "A Simple Subcircuit Extension of the BSIM3V3 Model for CMOS RF Design," *IEEE Journal of Solid-State Circuits*, Vol. 35, No. 4, April 2000, or W. Liu, et al., "RF MOSFET Modeling Accounting for Distributed Substrate and Channel Resistance with Emphasis on BSIM3V3 SPICE Model," *Digest of Technical Papers IEDM*-97, December 1997, pages 309-312, which is hereby incorporated by this reference. The choice of the number of resistors is a trade-off between the additional number of degrees of freedom afforded by the resistors during optimization and the resultant extended optimization time. For most applications, the three-resistor network of $R_{db}$ 131, $R_{sb}$ 133, and $R_{dsb}$ 114 shown in FIG. 1a is a good compromise.

Both for the substrate resistor network and the other external elements, FIG. 1a shows just one possible arrangement. Preferably the technique provides several different templates from which the user can choose, or else override if a desired choice is not provided. For example, in a particular application, the user may decide that a four-resistor substrate resistor network is preferable despite the extra time that the optimization process will require, or, alternately, that a single substrate transistor is sufficient. As another example, in some instances the user may include additional elements in series with the gate resistor $R_g$ 112, such as a parallel resistor/capacitor pair or an inductor if the MOS FET requires these additional external elements for an accurate characterization in the relevant frequency range. Also, it should again be noted that although this discussion is in terms of a basic transistor, this process also extends to other non-linear MOS devices.

The process of step 205 of FIG. 2 can be described conceptually by the diagram of FIG. 4. The S parameter measurement results and DC model of the device from step 201 are fed in to a block where the simulation engine provides the RF accurate model for the device. The idea is to present the circuit designer with the appropriate sub-circuit to use in the SPICE simulation of the larger circuit without having to worry about the details of the particular sub-circuit constructed, thereby treating it essentially as a black box provided by the model engineer and allowing the designer to simulate the circuit operation in real time. The operation of the simulation engine as described will itself utilize a SPICE simulation to produce the sub-circuit for the larger SPICE simulation of the circuit as a whole, but in a somewhat reverse manner from the usual analysis: Here the input is the DC behavior (such as the drain current, $I_d$, versus gate voltage, $V_g$) and the measurement results (the real and imaginary parts of the S parameters as a function of frequency) of the non-linear device, with the output as a sub-circuit with specified parameter values. This sub-circuit can then be entered as a macro within the SPICE netlist for the circuit.

The DC model used as a starting point for the low frequency characterization of the MOSFET can also account for a major portion of its high frequency behavior. However, to fully account for high frequencies, the various sub-circuit elements must have their values extracted and optimized. The prior art has tended to focus on the more traditional DC/low frequency operation of a MOSFET, or else focus on the radio frequency behavior. Balancing these two regions so that the model accurately represents the device throughout its operating range will often require some trade-off in its accuracy at one extreme or the other; however, the present invention allows the user to simultaneously optimize both these regions by choosing the targets most relevant to particular application at hand.

Returning to step 205, FIG. 5 is the chart for this sub-flow as outlined above. In step 301, the accuracy of the DC model is checked. In the exemplary embodiment, this is done by looking at the calculated value of the intrinsic $R_{ds}$. If, for example, this value as computed by BSIM3V3 does not exist or if the parameter value $R_{dsw}$ exceeds, say, 10, the DC model is taken to be incorrect and must be regenerated. Although this step is not required, it serves as an early check on the accuracy of the process. As the source to drain resistance varies with bias conditions, if $R_{dsw}$ is too big, then when this value is converted into the corresponding sub-circuit elements, the sub-circuit will not have the proper behavior. Therefore, the DC model is regenerated by altering the ACM parameters to get a different model.

Step 303 calculates the effective value for the external resistors connected to the source and drain by sharing the calculated drain to source resistance between $R_d$ 111 and $R_s$ 113. Again, the ACM parameters which would generate an internal drain/source resistance should be turned off as described above.

Step 305 generates external diodes $D_{db}$ 121 and $D_{sb}$ 123 of FIG. 1a, as described above. Additional diodes may need to be added due to a side wall capacitance of the source/drain junction under the gate. This is reflected by the model parameter Cjswg having a non-zero value. If this parameter is non-zero, a second external diode is added in parallel with the first for both the drain and the source sides and the corresponding built-in diodes in the model card should be turned off as was previously done for the junction diodes.

The substrate network is then generated in step 307. This can be the three-resistor network of FIG. 1a, another available template, or a user specified structure. At this stage, the sub-circuit has been automatically built from the DC model. In step 309, the DC output of the subcircuit is compared to the devices measured $I_d$ vs. $V_g$ behavior to check the accuracy of the construction.

Returning to FIG. 2, once the sub-circuit is built in step 205, physical extraction occurs in step 207. The purpose of physical extraction is to provide a good initial guess of the external model parameters of FIG. 1a. To carry out this extraction, the technique described in S. H. Jen, et al., "Accurate Modeling and Parameter Extraction for MOS transistors up to 10 GHz," *IEEE Transactions on Electronic Devices*, Vol. 46, No. 11, November 1999, and C. Enz, et al., "MOS Transistor Modeling for RF IC Design," *IEEE Transactions on Solid-State Circuits*, Vol. 35, No. 2, February 2000, which are both hereby included herein by this reference, is used with some modifications. For instance, due the difficulty in accurately measuring $Y_{12}$, it is not used in the preferred embodiment. Also, the effective channel length $L_{eff}$ is extracted for use in the calculation of the gate/source capacitance $C_{gs}$. Additionally, the technique described here begins by adjusting the DC model parameters of $G_m$ and $G_{ds}$ since a feature of the present invention is that the sub-circuit is built from this DC model. The sub-circuit of FIG. 1a is realized as a two-port Y parameter network. Its small-signal equivalent network is then used to derive mathematical expressions for the four parameters $Y_{11}$, $Y_{12}$, $Y_{21}$, and $Y_{22}$.

FIG. 6 is a small-signal equivalent circuit of FIG. 1a configured as a 2-port network. The corresponding nodes and elements of FIG. 6 are labelled the same as in FIG. 1a. This circuit can then be used to derive mathematical expressions for the Y parameters which will be used in extraction. These expressions relate the measurable quantities, namely the Y parameters, to the extrinsic elements. For example, when the two port system is measured in the strong inversion mode with a $V_{ds}$=0V bias and the device operating in the linear region, the $Y_{11}$ parameter can be expressed as $$Y_{11} = j\omega C_{gg} + \omega^2 (C_{gg}^2 R_g + C_{gs}^2 R_s + C_{gd}^2 R_d),$$

where $C_{gg} = C_{gd} + C_{gs} + C_{gb}$ is the total gate capacitance. Parameters can then be extracted by expressions such as $$C_{gg} = \left| \frac{\text{Im}(Y_{11})}{\omega} \right|.$$

Other parameters can use the expressions for the other Y parameters, such as $$C_{gd} = \left| \frac{\text{Im}(Y_{12})}{\omega} \right|,$$

with more details provided in the articles cited above. However, as noted above, for the particular case of $Y_{12}$, this parameter is generally very small and not easily measured, so that $C_{gd}$ is not readily extracted from this last formula.

Physical extraction is therefore a mathematical calculation which does not involve numerous iterations. Its accuracy is limited by the assumptions underlying its mathematical expressions, the assumptions being necessary to maintain simplicity and usefulness. These expressions are linear approximations of the behavior of a non-linear device, but they can provide an initial set of parameter values relatively quickly which can then be refined in later steps.

FIG. 7 is an extraction sub-flow giving more detail of step 207 of FIG. 2. Note that this exemplary extraction sub-flow begins by using gate capacitance and transcapacitances to extract gate resistance and overlap capacitance terms. This pair of extracted physical quantities are usually found to be important in producing good fitting results.

In step 401, the response parameter data measure in step 201 in the S representation are converted into the Y representation, Z representation, or a combination of these representations as these tend to be more closely related to the physical properties of the device than the S representation. Using these representations, the model parameters are first adjusted to fit the low frequency data points in step 403. This can be done for a frequency of, say, 100 MHz, where the standard modeling techniques are still relatively effective. Among the more useful parameters extracted here are the gate transconductance $G_m$ and the source/drain transconductance $G_{ds}(=1/R_{ds})$, which are the leading terms in the real portion of the analytical expressions for, respectively, $Y_{21}$ and $Y_{22}$. Thus, the extraction process here begins by adjusting this pair of DC model parameters. These two parameters decide $Y_{21}$ and $Y_{22}$ and are normally not predicted accurately by the DC model as this normally only accurate for the currents and not for their derivatives, $G_m = \partial I_d / \partial V_{gs}$ and $G_{ds} = \partial I_d / \partial V_{ds}$.

By using the low frequency SPICE model as described above, the $R_s$, $R_d$, and $C_{gg}$ values are calculated. The $R_s$ and $R_d$ are the external parameter in the sub-circuit of FIG. 1a. By subtracting the calculated $C_{gg}$ value from the $C_{gg}$, $C_{gs}$, and $C_{gd}$ values found from the Y parameter extraction, the extrinsic, overlap portion of these last two, $C_{gso}$ and $C_{gdo}$, for different biases are obtained. From this information, the bias dependent overlap parameters, which are part of the intrinsic MOSFET model in BSIM3V3, are extracted.

Step 405 extracts the gate resistance, $R_g$. The external $R_d/R_s$ value and $C_{gso}$ and $C_{gdo}$ values are subtracted to get $R_g$ for different biases. The bias dependent parameters can then be extracted to give the external parameter value for $R_g$. This value can be extracted as $\text{Re}(Y_{11})/[\text{Im}(Y_{11})]^2$.

In step 407 the resistance, $R_{sub}$, and junction capacitance, $C_{jbd}$, of the substrate network are extracted, where these values are combined effective values of the network. This provides the drain to substrate capacitance at different $V_{db}$ values. The result is then mapped on the sub-circuit based on the model to provide the diode model parameters for elements $D_{db}$ 121 and $D_{sb}$ 123 in FIG. 1a which are entered into the netlist for the diode portion of the sub-circuit. This result is also mapped onto the substrate resistor network to provide these external parameter values. This substrate network, which accounts for the high frequency coupling from the source and drain to the body, is mainly reflected in $Y_{22}$. In this embodiment of the extraction process, only an overall resistance $R_{sub}$ value is extracted. The correspondence between this overall resistance and the values of the network will depend upon the particular template or other choice selected by the user, with the various values adjusted as part of the optimization process.

Step 409 optimizes the junction capacitance from this response parameter $Y_{22}$, and is followed by the optimization of the effective channel length, $L_{eff}$, in step 411 from the response parameter $Y_{11}$. The value of $L_{eff}$ is extracted from its relation to $C_{gs}$, of which $Y_{11}$ is a function. This effective channel length is mainly used for the values of the intrinsic capacitances for intrinsic MOSFET 100. The optimization in both steps 409 and 411 is a "local optimization" performed as part of the extraction routine, as opposed to the "global optimization" of step 213 in FIG. 2, where the user selects the parameter and data used.

Some of the previous model parameter values determined by physical extraction can be changed in order to achieve even better fitting accuracy between measured and simulated response parameter characteristics. This optimization process is more complex for the high frequency MOSFET model extraction because of the sub-circuit nature of the model. The introduction of so many extrinsic elements requires the optimization of a circuit in contrast to a single device used in traditional low frequency modeling. Despite the relatively small size of the circuit, this places high-speed requirements on the circuit simulator, which by default is of the SPICE variety and not know for speedy calculations.

An alternate approach is to consider the optimization problem in a slightly different manner. Optimization is essentially a simulation intensive procedure and can be performed using standard numerical techniques such as "Powell's Quadratically Convergent Method" and "Downhill Simplex Method". Thus any method which can reduce the simulation time will ultimately improve optimization speeds. The smooth, monotonic behavior of the response parameters in the Y representation can be exploited to reduce the amount of simulation. Because of these properties, it may not be necessary to simulate and optimize every measured bias point. Mathematical functions can be used to link together the many bias points. This allows the ability to accurately predict the overall trends through the simulation of a subset of the original bias points. For example, if every tenth data point is used, then the simulation time would be reduces by an order of magnitude.

A fast simulation algorithm is beneficial not just from a pure optimization point of view. It can also help in deciding which model parameters should be selected for optimization. Interactive sensitivity analysis would allow model parameter values to be changed and the resulting effect on Y parameters characteristics of the entire sub-circuit be seen in real time. Thus, a chosen input parameter can be changed and the resultant effect on a selected response parameter can be viewed within a matter of seconds, without the extended wait that would result if a full SPICE simulation was required for all of the bias points. This feature can help to zero in on the most sensitive set of parameters, thereby reducing the optimization time.

A number of examples of sub-circuit parameters and a corresponding collection of preferred response parameters are shown in Table 1. One or more of these sub-circuit parameters are the input, with one or more response parameters are the fitting targets. By comparing the data values with the simulation values in the fitting target, the sensitivity of the fitting targets on the input parameters can be analyzed.

TABLE 1

| Parameter to be Optimized | Fitting Target |
| --- | --- |
| $R_g$ | $Re(Y_{11})$ |
| $R_{dsb}$, Rsb, $R_{db}$ | $Re(Y_{22})$, $Im(Y_{22})$ |
| $C_{gso}$ | $Im(Y_{11})$ |
| $C_{gdo}$ | $Im(Y_{12})$, $Im(Y_{21})$ |
| $C_{gbo}$ | $Im(Y_{11})$, $Im(Y_{12})$, $Im(Y_{21})$ |

The sensitivity analysis and optimization process is contained in steps 209, 211 and 213 of FIG. 2. In step 209 the response parameters are simulated. This can either be done in either the S representation, in which the data was originally measured, or in another representation. If done in another representation, to compare the simulation with the data, the simulation must be converted to the S representation, the data must be converted to representation where the simulation is done, or both must be converted to the same, third representation. Which choice, or combination or choices, is used will depend upon how the user wishes to display the fitting targets in the equalizer window of step 211. The chosen input (sub-circuit) parameters will then also be displayed on the equalizer window and can then be adjusted during the optimization of step 213. This may then require recomputations of step 209 until the desired level of optimization is reached.

One aspect of the present invention is that the optimization process is a multi-object optimization. Steps 201-207 of FIG. 2 have constructed a DC model to account for the low-frequency behavior of the MOSFET, produced a sub-circuit, and extracted an initial set of parameter values for the elements of this sub-circuit. The optimization process which follows is directed to optimizing both the DC and the high-frequency response of the sub-circuit simultaneously; below, this will be extended to also include noise modelling. By allowing the user to select the optimization targets, the process can focus on those aspects of the device's characterization most relevant to the user's specific design process.

FIG. 8 is a flow chart showing step 209 in more detail. This starts in with step 501 reading in the sub-circuit constructed in step 205 and having the initial values from the physical extraction of step 207. Using this information, the DC operation point is solved in step 503 by setting the external $V_g$ and $V_s$ values to get values at the internal nodes. This DC simulation result is preferably saved into an array in order to boost the speed of iteration. This is followed by step 505 which calculates the value of the small signal components in each non-linear device in the sub-circuit. The contribution of each component to the admittance matrix, both the frequency dependent and independent parts, will also preferably be saved in an array as this will greatly boost the speed of simulation when the frequencies are swept. In steps 507 and 509, the various response parameters in the Y representation are computed in the standard way by setting the voltages at the two ports. Finally, in step 511 these results are converted back into the S parameter representation or other representation which will be used for sensitivity analysis. Since the simulation will generally be done a number of times as part of the sensitivity analysis and optimization process, steps 507-511 will actually form a loop done in each iteration of the simulation.

Steps 507 and 509 will preferably not calculate all frequency points, thereby further increasing the speed of iteration. Of the N data points, a subset of points will be selected, with the actual size of the step based on N. The Y parameters for this subset of points is then simulated, with a total of eight values, corresponding to the real and imaginary parts of the four Y parameters, for each point. For example, in practice a common set of data points will often consist of about 400 frequency values, of which only every twentieth will be initially be simulated.

The simulated data points will be broken into two groups, with the first group used to interpolate the value of the Y parameters for all N of the frequency points and the second group used to check the convergence of the interpolation. This is done by taking one point of the second group between each pair of points in the first group; that is, of the subgroup of frequency points used for the simulation, the odd frequency points would be the basis for the interpolation which is then compared with the actual simulation value at the even frequency points.

(It should be noted that at this stage the simulation points are not being compared to the actual measured response at the various frequency points. Although the N frequency points are themselves determined by where the response is measured, at this point the comparison is only between the interpolated simulation values and the directly computed simulation values at the second group from the chosen subset of these frequency points. The comparison of the simulation with the measured response occurs in the optimization process.)

Using the first group, consisting of the first, third, fifth, and so on points of the subset of frequency points, the values for the Y parameters of all of the frequency points can be interpolated by cubic splines or other standard technique. The result of the interpolation function can then be compared to the simulated value for accuracy at each of the second group of points. If the difference is beyond a bound at a particular one of the this second group, an extra frequency point in this particular interpolation region can be added to improve the interpolation. The process is then repeated. Once all the checked frequency points satisfy the convergence criteria, the resultant interpolation function can be used to calculate the response parameters for the rest of the data points.

FIG. 9 is a detail flow of this interpolation process. In step 601, m data points are chosen to simulate, where the size of the step between the m points will usually be based on how big the collection of N data points is. For example, if N=400, simulating every twentieth point may be adequate given the smoothness of the Y parameters. In step 603, the Y parameters of the initial m data points are each simulated, resulting in 8 m values as there are four response parameters, each with a real and imaginary part indicated on FIG. 8 by .x and .y, respectively. For each of these eight parameters, an interpolation loop is then performed as indicated in step 605.

In step 607, the odd ones of the m data points are used as the basis for the interpolation. A cubic spline interpolation is then done between these odd points and, using this interpolation, the Y parameters of the even points are computed. The result is that for the even data points, there are now two values, the value $Y_{in}$ calculated using the interpolation and the value $Y_e$ which was directly simulated from the model back in step 603.

Step 609 then checks the difference between the interpolated and simulated Y values of these m points. Here, the error at each point is quantified as $(Y_{in}-Y_e)/Y_e$. If this error exceeds a chosen value, say $(Y_{in}-Y_e)/Y_e > 0.001$, or a 0.1% error, for a particular point, an additional point between the two points chosen in step 607 bordering this particular point is added to the set of points used to perform the interpolation. Once the interpolation is accurate enough, step 609 passes on to step 613, with the resultant cubic spline function being used to calculate the rest of the data points. This process is repeated for each of the eight independent components of the Y parameters.

By reducing the number points simulated for a set of input parameters, the time required for simulating the response parameters is correspondingly decreased. This allows the sensitivity analysis to be performed interactively with the equalizer window of step 211 in FIG. 2 as the change in the response parameters resulting from a variation of an input parameter can be seen in real time.

The equalizer window of step 211 in FIG. 2 is a method to quickly and graphically check the sensitivity of any instance or model parameter to the target. The instance parameters are those device properties enterer into the netlist as part of the intrinsic description of a device, including things such as the resistances, the channel width, or the channel length, while the model parameters are the various coefficients that show up in, for example, the BSIM3V3 model of how a operates or the values of the external elements forming the sub-circuit. Which of these parameters are used as input is user selectable and the available choices will depend on the topology used for the subcircuit. The target is any user definable design criteria which can be calculated from the S parameters, such as the transistors cut off frequency, input impedance vs. gain, output impedance, gain vs. frequency, and so on. Both the particular targets themselves and their value ranges can be chosen. This information is preferable displayed on a computer monitor as one or a number of screens of a graphic user interface.

The netlist file user input will be parsed and the content of the netlist file will be displayed, for example in a tree view. Any one or more of the instance or model parameters can be selected and dragged to a panel window. A vertical scroll bar can then be used to represent the value the parameters with the upper and lower boundary of their selected ranges. The selected response parameters will then be displayed dynamically using the simulation of step 209. This information forms the equalizer window.

FIG. 10 is an exemplary embodiment of an equalizer window in one configuration. In this configuration, the all of the components of the Y representation of the response has been chosen for display on the screen. The $Y_{11}$ values are shown in section 1201. The real and imaginary parts are displayed for both the measured and the simulated response over the chosen target range at the specified bias voltages. Overlying these response curves, a pair of windows have been opened. The option set up display 1220 provides some of the various options from which the user can choose. This example shows that the simulation step size has been set at 5, the real and imaginary parts of the Y parameters have been selected for display, and that the current display is the twentieth iteration of the process.

The second window opened is parameter equalizer 1210. This example shows that five parameters have been chosen for use in the optimization process, specifically the gate and substrate resistances and several of the overlap capacitances. The particular parameters used and their range has previous been selected by the user and placed in the window 1210. The parameters available for selection will depend upon the topology of the sub-circuit built to represent the device. When the scroll bar of one or more of these parameters is changed, the new values will be used to alter simulation. Due to the improvements in speed obtained by the method described for the process of FIG. 2, the new result will then be displayed in real time, occurring within seconds of the parameter adjustments. This will be reflected in the simulated values displayed for the targets, such as in the graph 1201 for $Y_{11}$. This provides the user with a graphic display of both the accuracy of the current simulation and the sensitivity of the simulation to the altered parameters.

The parameters in the equalizer window are employed in the optimization of step 213 of FIG. 2. The targets of optimization are selected from the graphic interface. The user can use the mouse to draw a region in the graphic, or, alternately, specify the information with the keyboard, and all the data points in this region will be used for optimization. This allows the circuit to be optimized over the full range of interest to the user with particular emphasis place on those parameters consider most relevant. The user can further change the data by inputting step, relative weight assigned to particular points, and using the real or imaginary parts of the response parameters.

By use of an open interface, the user is allowed to build their own target to optimize for the particular subcircuit. The user will, preferably, supply three functions to generate the graphics. The first function will supply the axis of the properties, consisting of information such as the title, x-axis label, and y-axis label. The second function will set up the graphic properties, for example, whether the graph is linear or logarithmic. The third function will determine the x and y plot data array with the minimum and maximum values of the data range. The user can then select the optimization target from these graphics.

So far, the process has considered a specific device and, in particular, a specific example of this device having a specific set of values for its parameters. For a typical device as actually encountered on the circuit, these parameters will fall in a distribution of values, due to process and other factor variations. The procedure, and corresponding results, of steps 201 to 213 in the flow in FIG. 2 have relied on a single set of parameters. This set of parameters can be some sort of mean extracted from a number of device examples or, more commonly, a set of values from an example of the device made to more exacting standards, a "golden die". Alternately, the values may not correspond to measured values, but projected or test values used to determine whether a device will meet a set of design criteria.

Once the particular example of the device has gone through the steps of FIG. 2 up to the optimization of step 213, the result is a typical, or "center", model of the device's behavior. It is this center model which is then entered as the sub-circuit into the netlist, serving as the "black box" representing the MOSFET for the design engineer. This center model can be used to predict the circuit performance distribution, including characteristics which are not directly measurable, based upon the distribution of circuit characteristics which are measurable. These input distributions can either be measured from the actual devices as Electrical Test (ET) data or supplied as projected process variations. Steps 215 and 217 provide the information on how these factor variations will affect device performance.

FIG. 11 provides a more detailed flow chart for the Monte Carlo simulation and how this is calibrated with the electrical test results. The input for this process will be the distribution of values for device parameters, such as the transistor threshold voltage $V_{th}$, the transconductance $G_m (=\partial I_d/\partial V_{gs})$, the drain to source conductance $G_{ds} (=R_{ds}^{-1}=\partial I_d/\partial V_{ds})$, or the gate/drain overlap capacitance $C_{gdo}$. These distributions may be the mean and standard deviation from actual electrical test data on a number of the devices, or, for example, a set of projected values from the foundry producing the devices. As with the equalizer window, the variables input at step 701 can be instance parameters or model parameters as chosen by the user.

Step 703 calibrates the Monte Carlo simulation with these electrical test data to improve its accuracy by automatically adjusting the mean and standard deviation of the Monte Carlo. The user inputs the ET distributions, such as the Gm distribution or the gate to channel capacitance, Cgc, distribution, which the internal optimization routine will automatically use to adjust the distribution of the selected model and instance parameters to fit the measured ET distribution.

In this process, there are two sorts of Monte Carlo simulation targets. The first of these are quantities whose variations are easily measured, such as the Gm or Cgc distribution. The second are those which can not have their distributions easily be measured, such as the response parameters like $Y_{21}$. The first type is used to calibrate the Monte Carlo simulation: since the distributions of these are known, by treating these as the output of the calibration process, the distribution of the simulation's input parameters, such as the threshold voltage at $V_{B=}0$ bias, $V_{th0}$, or mobility, $\mu_0$, can have their distributions calibrated to produce the correct output. Once the Monte Carlo simulation is calibrated on this first type, a separate simulation calculates the second type of target, such as $Y_{21}$ in step 707.

It is the various instance and model parameters, such as $V_{th0}$ or $\mu_0$ noted above, which are used to simulate the responses, such as $Y_{21}$, which form the second type of targets. The distribution of the these second type of targets are not easily calculated directly, but are instead simulated using the distribution of the various instance and model parameters. However, many of these are not easily obtainable either. Although their mean values are found as part of the preceding optimization process, their spread is not readily measured through electrical test data. The calibration process is used to determine these distributions. Starting with the mean and either a default or user selected standard deviation for a selected set of these parameters, a Monte Carlo simulation is then performed to find the result distribution for a set of values which are easily measured in an electrical test, such as the Gm or Cgc distribution, and form the first type of targets. By comparing the distribution from the simulation with the electrical test data for these first targets, the accuracy of the standard deviations of the selected set of parameters can be determined. These standard deviations can then be adjusted and the process repeated until the desired accuracy is obtained.

A useful feature of the present invention is that the standard deviations of the various selected parameters can be independently varied to obtain a better calibration. Also, since the user is free to select which of these parameters are calibrated, the set chosen can be changed during the process if needed to improve either accuracy or speed. As usual, the number of parameters selected is a trade off between accuracy and speed, since a larger number of parameters provides a more accurate simulation of the distribution, but at the cost of more computation.

In step 705 the (second) target set is chosen for the Monte Carlo simulation much as for the optimization procedure. Additionally, the user supplies the simulation number, for example specifying that two hundred random simulations should be performed. Then, generating random values based on the distributions of the input parameters, the previously generated and optimized sub-circuit simulates the output distribution in step 707. The distribution is then plotted according to the specified target.

In the prior art uses of Monte Carlo simulation, the process was only carried out for the transistor itself based upon its model parameters. With the DC operation of a transistor, this would be the current behavior of the single element. In the present use for high frequency MOSFET modeling, not just the current, but effects due to device geometry, capacitance, inductance, and other properties must be accounted for. Furthermore, the basic transistor of the DC model has been replaced with the extracted and optimized sub-circuit as selected by the user. Consequently, instead of a few model based calculations using a known set of equations, the Monte Carlo simulation now employs the SPICE, or other model, based engine used in the simulation of the earlier steps of FIG. 2. Additionally, the user can select the actual variables both for the calibration and the eventual output of the simulation's target.

Once the Monte Carlo simulation of step 215 is complete, the corner model is generated in step 217. The corner model is used to study the worst and best case behavior of the non-linear circuit element for the distribution of values due to factor variations. From this information, the yield for the actual device production can be determined.

The circuit designer will usually have a set of requirements which the non-linear element whose subcircuit is being simulated in the steps of FIG. 2 should meet within the larger circuit of which it is a part, along with an idea of what is considered an acceptable yield. The typical model behavior, together with the worst and best case models, can then be given to the previously generated sub-circuit to find the resultant value for the parameter selected, say the device speed. The result will be a distribution of device speeds based upon the sub-circuit simulation of the earlier steps. The designer can then see how closely this corresponds to the requirements and how many of the devices will lie beyond three standard deviations ($3\sigma$) of the mean, or other selected cut-off corner. For example, a power range of the device may be specified from the design specification of the circuit containing it. The user will choose the input parameter, such as device speed, and get out the corresponding values of the device voltages, from which the designer can then see if the worst and best case values lie within the specified power range.

FIG. 12 is flow chart providing more detail for step 217 of FIG. 2, where the user inputs the process corner to be generated. This can be a real measured electric test value, such as the saturation current $I_{dsat}$ or the transconductance $G_m$, or a processor specification. The user will also specify which instance parameters, model parameters, or both will be changed. Once this information is specified, the optimization routine will then automatically generate the chosen corner model.

In step 801, the distribution of the selected targets from the Monte Carlo process are plotted. The user then inputs a set of criteria for the best or worse case. In the example shown in the flow chart, this would be the speed lying at $3\sigma$ above the mean and the power consumption at $3\sigma$ below the mean. The corresponding data point in the target's distribution is then found in step 805, from which the model and instance parameters are obtained in step 807. These values for the model and instance parameter values then replace the values form the typical model to produce the corner model.

FIG. 13 shows an example of how the corner model data may be displayed in a particular embodiment. This shows the distribution for several targets in sub-screens 1501-1503. Here these are displayed as histograms with the corresponding Gaussian distribution overlaid and the corresponding mean and standard deviations displayed. Concurrently displayed is a datasheet 1510 with the die name listed for the various runs and the values for four targets listed. The fourth target's distribution is not displayed, but could be viewed if the overlaying datasheet 1510 were closed. In the example above, targets 1 and 2 could represent a pair of device voltages, with target 3 as device speed and target 4 as some other parameter not discussed in the example.

Determination of circuit noise performance is generally extremely important in circuit design. The accuracy of noise modelling and characterization depends on the accuracy of the circuit model. Every element in the sub-circuit of FIG. 1a will contribute noise to some degree. It its most general form, each of these elements would have a noise current source attached in parallel. In most cases, the channel thermal noise is the dominant noise source and should be carefully modelled. This is done by connecting a current source across the channel connected inside of the external source and drain resistances of FIG. 1a. For the present discussion, the other noise sources are ignored, but may be included in much the same manner.

Within the SPICE2 simulation, thermal noise is modeled by the expression $$I_{d,noise} = \frac{8k_B T}{3}(G_m + G_{mbs} + G_{ds}),$$

where $k_B$ is the Boltzman constant. To more accurately model this behavior, this expression is replaced with the more general $I_{d,noise} = \alpha k_B T(G_m + G_{mbs} + G_{ds})$. The procedure for determining and optimizing the noise model is similar to the procedure as done above. Much as a large portion of the high frequency behavior of the MOSFET is determined by its DC model, a significant portion of the model's noise modelling is already determined by the process of FIG. 2 through step 211. Starting with the sub-circuit as simultaneously optimized for both DC and high frequency operation, the noise modelling follows before proceeding to calibrate the Monte Carlo simulation.

An important quantity in the description of noise in a two port network is the noise figure F, $$F = \frac{S_i/N_i}{S_o/N_o} = 1 + \frac{N_a}{G_a N_i},$$

where $S_i$ and $N_i$ are respectively the signal and noise for the input port, $S_o$ and $N_o$ the corresponding values at the output port, and $G_a$ and Na are respectively the gain and noise added by the actual device. The noise figure F is known to be a function of the source admittance $Y_s$, having a minimum $F_{min}$ at a value of this source admittance $Y_{opt}$ and increasing roughly quadratically with Y about this minimum. This allows F to be expressed as $$F = F_{min} + \frac{R_n}{G_s}|Y_s - Y_{opt}|^2,$$

where $R_n$ is the noise resistance of the device. The parameters $F_{min}$, $R_n$, and $Y_{opt}$ are the noise parameters of the device and are frequency dependent.

As with the earlier stages in the method of the present invention, the values for these parameters are measured, de-embedded, and a physical extraction is performed. The noise data is then simulated and compared with the measured data and optimized as part of a multi-object optimization which now includes noise in addition to the DC and high frequency characterizations.

As before, only a subset of the actual frequency points are simulated, the remainder being found by interpolation. In one embodiment, to further increase speed, the simulation engine uses a "direct matrix method" to calculate the noise characterization. This method allows the noise parameters to be determined for the sub-circuit with arbitrary topology and without restrictions on noise source correlations. Several matrix arrays are opened in the engine to remember the frequent depend and independent components. More details of this method can be found in M. E. Mokari, et al., "A New Method of Noise Parameter Calculation Using Direct Matrix Analysis," *IEEE Transactions on Circuits and Systems*-1: *Fundamental Theory and Applications*, Vol. 39, No. 9, September 1992, pp. 767-771, which is hereby incorporated by this reference.

As the noise characterization is determined to a fairly high degree by the DC and high frequency characterizations, much of the noise behavior has been determined in the preceding steps. When the noise data is included in the optimization process of step 213, the noise parameters are now also included among the available targets. Thus, the equalizer window will allow the user to display $F_{min}$, $R_n$, and the real and imaginary parts of $Y_{opt}$ versus frequency so that the simulated and measured values can be compared over the selected ranges. As is usual in such a multi-object optimization process, due to model limitations a trade off between DC fitting error, high frequency fitting error and noise characterization is likely necessary.

Many aspects of the methods of the present invention will most commonly be implemented in software as a computer program product, although many of these can be implemented in hardware or by a combination of software and hardware. As will be understood in the art, the invention or components thereof may be embodied in a fixed media program component containing logic instructions and/or data that when loaded into an appropriately configured computing device cause that device to perform according to the invention. As will be understood in the art, a fixed media program may be delivered to a user on a fixed media for loading in a users computer or a fixed media program can reside on a remote server that a user accesses through a communication medium in order to download a program component. Examples of such fixed media include a disk-type optical or magnetic media, magnetic tape, solid state memory, etc. The invention may be embodied in whole or in part as software recorded on this fixed media.

The invention also may be embodied in whole or in part within the circuitry of an application specific integrated circuit (ASIC) or a programmable logic device (PLD). In such a case, the invention may be embodied in a computer understandable descriptor language which may be used to create an ASIC or PLD that operates as herein described.

Various details of the implementation and method are merely illustrative of the invention. It will be understood that various changes in such details may be within the scope of the invention, which is to be limited only by the appended claims.

What is claimed is:

1. A computer-implemented method of graphically presenting parameter sensitivity of a sub-circuit of a non-linear device, the method comprising:
   receiving a model of the sub-circuit, the model of the sub-circuit being dependent upon a plurality of model specific parameters;
   receiving a set of input variables to be presented, wherein said input variables are selected from the model specific parameters;
   receiving a simulation target set to be displayed, wherein elements of the simulation target set are derivable from response characteristics of the sub-circuit as determined by the model; and
   dynamically providing on a graphical user interface on a computer monitor a graphical representation of the simulation target set based upon values of said input variables.

2. The method of claim 1, wherein said dynamically providing a graphical representation comprises:
   receiving selected values for the input variables; and
   graphically displaying the graphical representation of the simulation target set for the selected values of the input variables.

3. The method of claim 2, further comprising receiving a specified parameter range of the input variables.

4. The method of claim 2, further comprising receiving specified graphical properties of the graphical representation.

5. The method of claim 2, wherein the elements of the simulation target set are calculable from S parameters of the sub-circuit as determined by the model.

6. The method of claim 5, wherein the elements of the simulation target set are further calculable from DC behavior of the sub-circuit as determined by the model.

7. The method of claim 2, wherein the elements of the simulation target set are selectable from DC characterization, high frequency characterization, gain, the power consumption, and response parameters of the sub-circuit.

8. The method of claim 2, wherein said input variables are presented as a sub-window of the graphical user interface.

9. The method of claim 2, further comprising:
   receiving specified data values of the response characteristics of the non-linear device for the simulation target set; and
   providing a graphical representation of the data values concurrently with the values determined by the model of the simulation target set based upon the values of said input variables chosen from a parameter range.

* * * * *